United States Patent [19]
Matsuse et al.

[11] Patent Number: 5,951,772
[45] Date of Patent: Sep. 14, 1999

[54] VACUUM PROCESSING APPARATUS

[75] Inventors: Kimihiro Matsuse, Tokyo; Hideki Lee, Nirasaki; Hatsuo Osada; Sumi Tanaka, both of Yamanashi-ken, all of Japan

[73] Assignee: Tokyo Electron Limited, Tokyo, Japan

[21] Appl. No.: 08/803,008

[22] Filed: Feb. 21, 1997

Related U.S. Application Data

[63] Continuation of application No. 08/255,924, Jun. 7, 1994, Pat. No. 5,647,945.

[30] Foreign Application Priority Data

| | | | |
|---|---|---|---|
| Aug. 25, 1993 | [JP] | Japan | 5-232340 |
| Sep. 17, 1993 | [JP] | Japan | 5-254683 |
| Sep. 17, 1993 | [JP] | Japan | 5-254684 |
| Sep. 17, 1993 | [JP] | Japan | 5-254685 |
| Sep. 17, 1993 | [JP] | Japan | 5-254686 |
| Sep. 20, 1993 | [JP] | Japan | 5-256505 |
| Feb. 8, 1994 | [JP] | Japan | 6-036425 |

[51] Int. Cl.$^6$ .................................................. C23C 16/00
[52] U.S. Cl. .................. 118/723 R; 134/1.1; 156/345; 118/724
[58] Field of Search .................... 118/719, 715, 118/724, 723 R; 156/345; 134/1.1

[56] References Cited

U.S. PATENT DOCUMENTS

| | | | |
|---|---|---|---|
| 4,798,166 | 1/1989 | Hirooka et al. | 118/719 |
| 4,987,856 | 1/1991 | Hey et al. | 118/723 |
| 5,133,284 | 7/1992 | Thomas et al. | 118/719 |
| 5,425,842 | 6/1995 | Zijlstra | 156/643.1 |
| 5,505,778 | 4/1996 | Ono et al. | 156/625.1 |
| 5,580,822 | 12/1996 | Hayakawa et al. | 437/187 |

*Primary Examiner*—Bruce Breneman
*Assistant Examiner*—Luz Alejandro
*Attorney, Agent, or Firm*—Oblon, Spivak, McClelland, Maier & Neustadt, P.C.

[57] ABSTRACT

A vacuum processing apparatus includes: a vacuum processing chamber for processing a target object; a processing gas supply source for supplying a processing gas by which a process is performed to the target object in the vacuum processing chamber; a processing gas supply pipe for supplying the processing gas from the processing gas supply source into the vacuum processing chamber; and a pressure reducing valve for keeping the gas supply pipe at a lower pressure than the atmospheric pressure when the processing gas is to be supplied to the vacuum processing chamber.

5 Claims, 10 Drawing Sheets

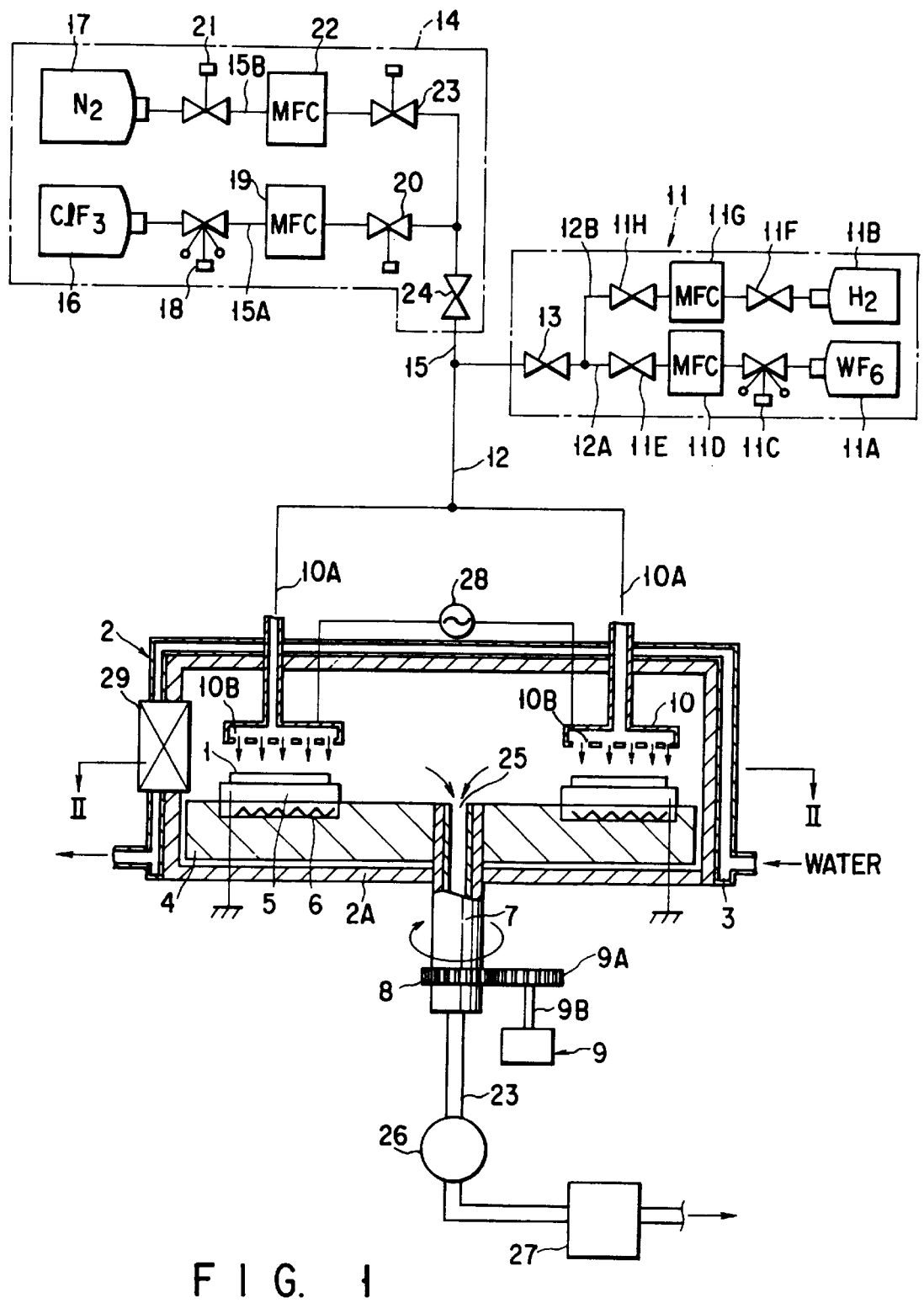
F I G. 1

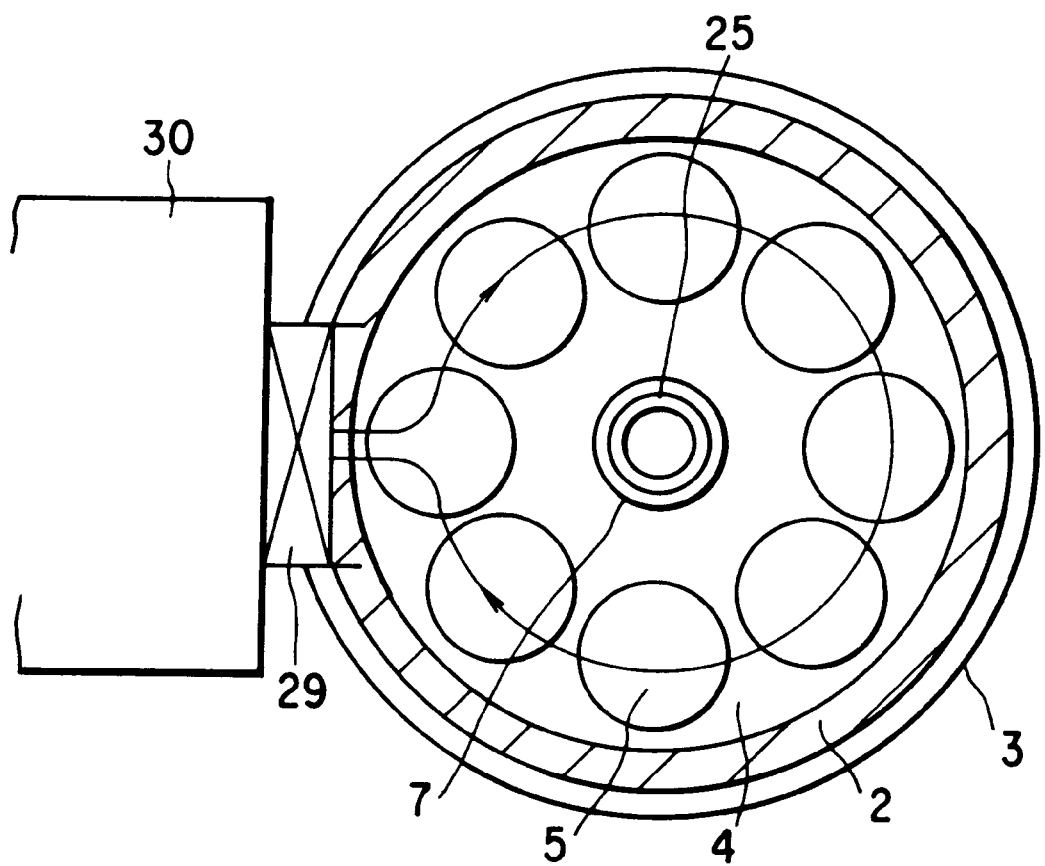
F I G. 2

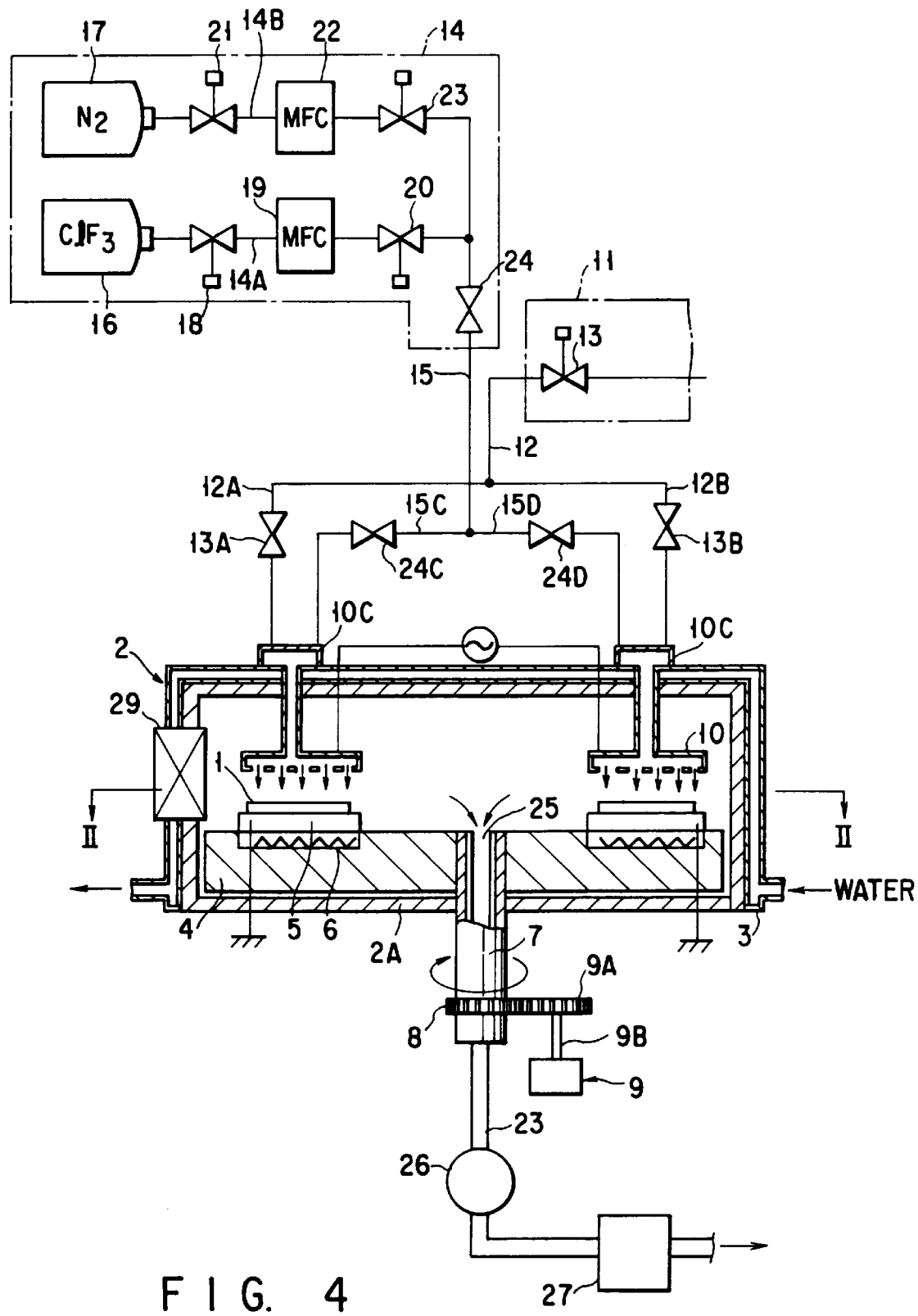
F I G. 4

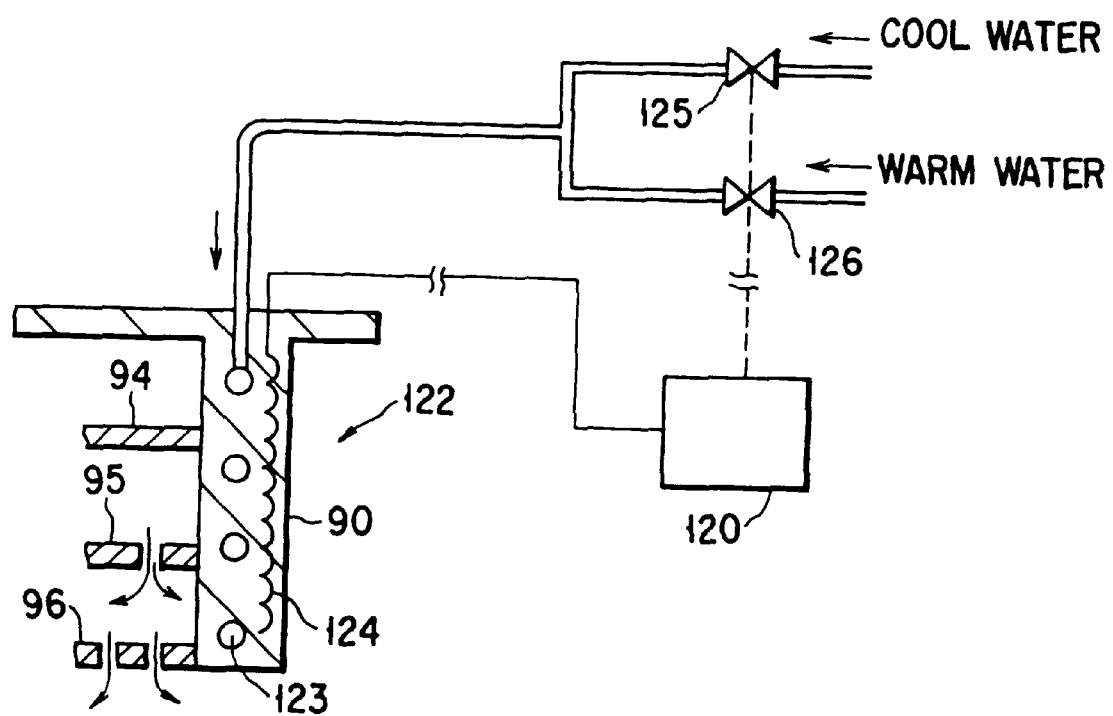
F I G. 6

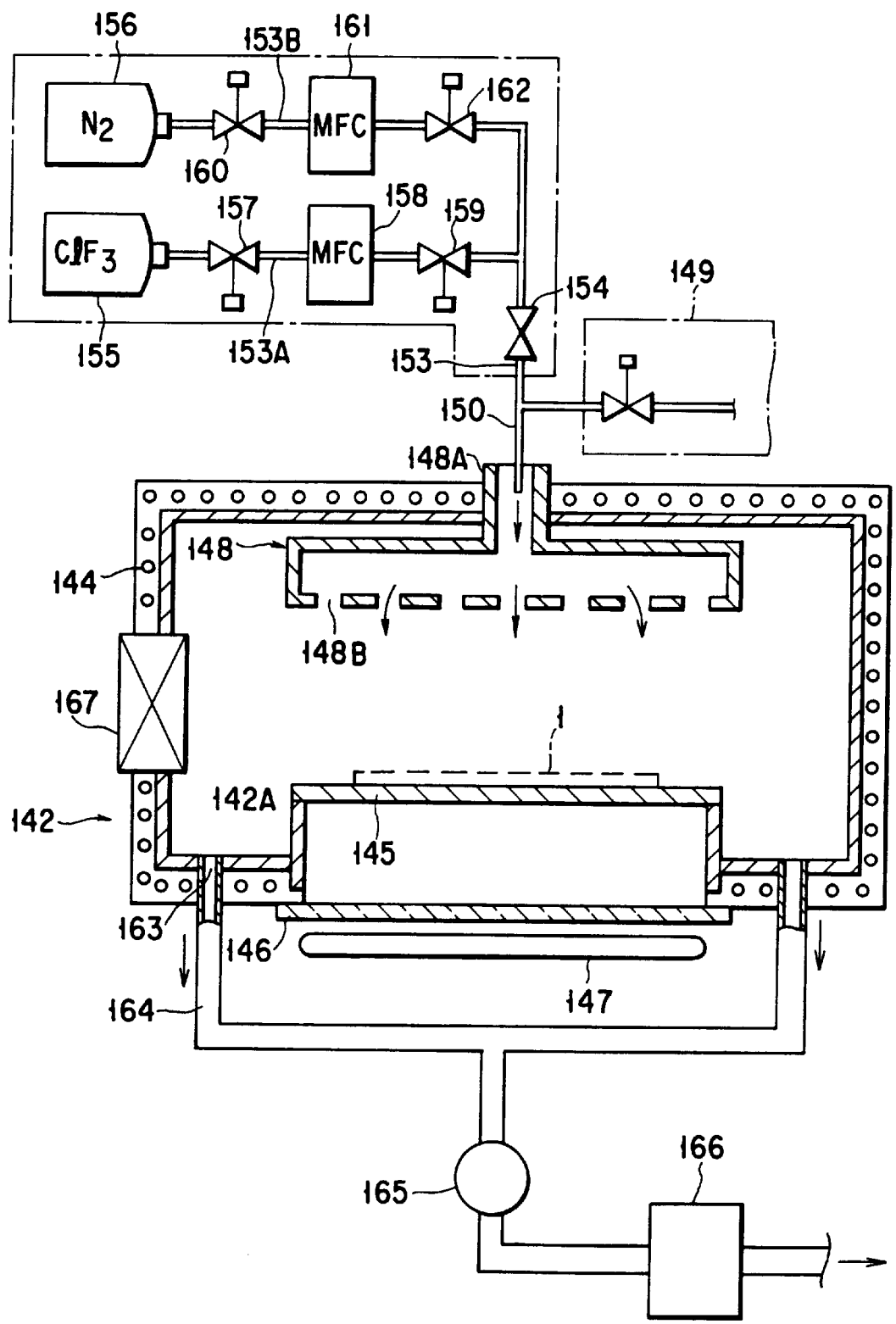
F I G. 8

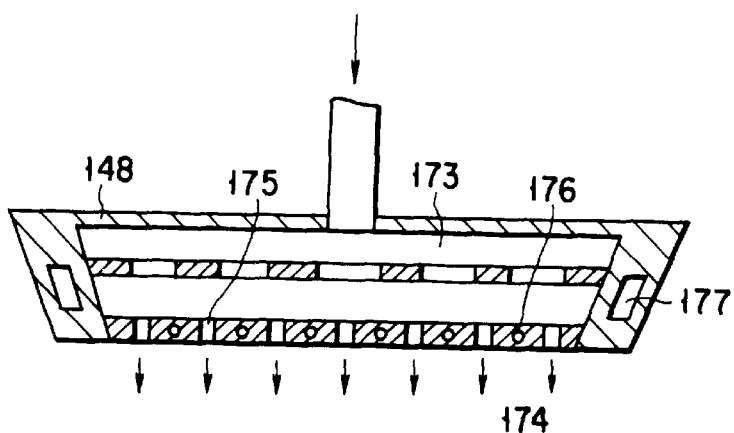
F I G. 11
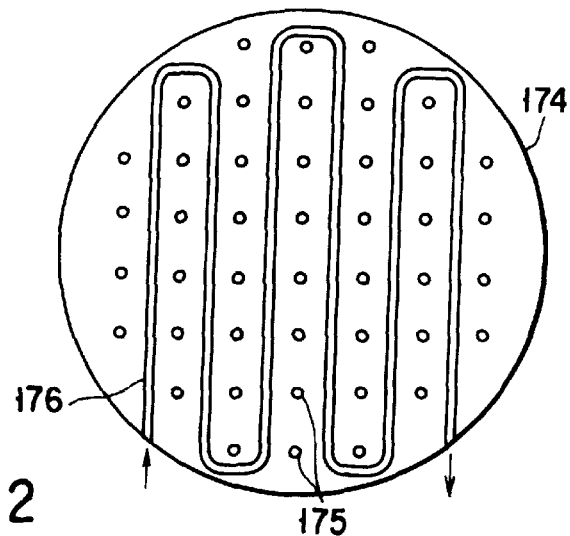
F I G. 12
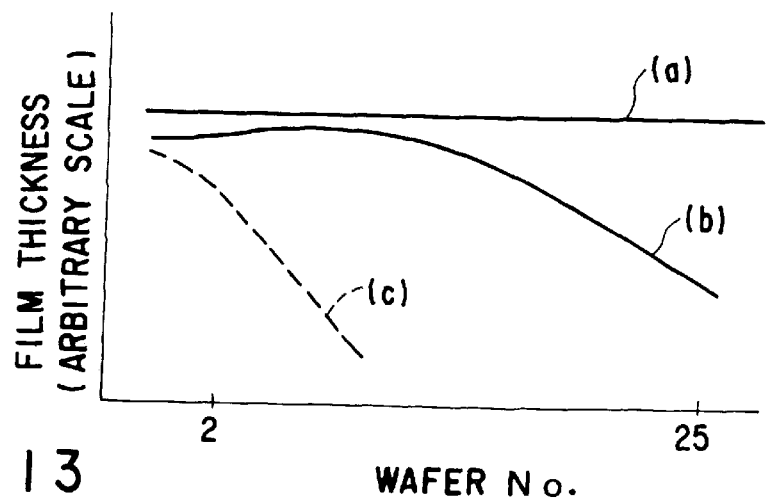
F I G. 13

VACUUM PROCESSING APPARATUS

This is a continuation, of application Ser. No. 08/255,924 filed on Jun. 7, 1994, now U.S. Pat. No. 5,647,945.

BACKGROUND OF THE INVENTION

1. Background of the Invention

The present invention relates to a vacuum processing apparatus for processing a target object such as a semiconductor device, a method of supplying a processing gas such as a cleaning gas into the vacuum processing apparatus, and a method for cleaning the processing apparatus.

2. Description of the Related Art

In recent years, the integration density of a semiconductor integrated circuit element has increased, and the degree of integration has changed from the 64-M DRAM generation to the 256-M DRAM generation. For this reason, the number of layers of a wiring structure has more increased, and micropatterning thereof has become more conspicuous.

When the number of layers of the wiring structure increases as described above, the number of steps of a wiring process increases, and an increase in efficiency of the wiring process and dustproof measures therefor have posed problems more seriously than those of the conventional technique. In addition, with an increase in micropatterning level of the wiring structure, a migration disconnection becomes a problem in a conventional aluminum (Al) wiring structure. Therefore, as a wiring material replaceable with Al, a metal such as tungsten (W) having an excellent resistance to migration disconnection is variously examined. In addition, inorganic-based materials and an organic-based materials are used to these materials.

Conventionally, an inorganic-based compound and an organic-based compound are used for the wiring and insulating materials. Some organic-based compounds such as a carbonyl compound are gaseous at room temperature, but many organic-based compounds such as an alkyl metal compound are liquid at room temperature. In contrast to this, many inorganic-based compounds are gaseous at room temperature. For example, tungsten hexafluoride ($WF_6$: b.p. 17.2° C.), dichlorosilane ($SiH_2Cl_2$: b.p. 8.2° C.), chlorine trifluoride ($ClF_3$: b.p. 11.75° C.), and the like have relatively higher boiling points in inorganic-based compounds, and they are liquid within the range of 0° C. to room temperature. These inorganic-based compounds are often used for a film formation process or an etching process. Conventionally, when these inorganic-based compounds are used for a film formation process, such an inorganic-based compound is heated to be completely gasified as a processing gas for a film formation process or the like. Then, the gas is supplied into a processing chamber by adjusting the flow rate of the gas using a mass-flow controller. A conventional method of supplying a processing gas by heating is a method wherein a pipe or the like which connects a reservoir vessel to a predetermined processing chamber is covered with a heating tape or the like, and an inorganic-based compound therein is heated by this heating tape through the vessel, the pipe, and the like. In heating, the inorganic-based compound in the vessel is heated to a temperature around its boiling point. The pipe is heated such that its temperature is gradually increased, from the vessel to the processing chamber, in the pipe which extends from the vessel to the processing chamber, and the temperature becomes the highest near the processing chamber. A processing gas heated and flow-adjusted as described above can be supplied into the processing chamber without being liquefied in the pipe. The supplied processing gas is used for film formation as of a predetermined wiring film or an insulating interlayer on the surface of a target object in the processing chamber using a thermal CVD process, a plasma CVD process, or the like.

On the other hand, when a predetermined film formation process is repeated several times during heating an inorganic-based compound as described above, films are formed in the processing chamber as those on the target object. These films are eventually peeled to cause particles, resulting in a decrease in yield of products. For this reason, conventionally, when the film formation process is repeated a predetermined number of times, the processing chamber is cleaned to remove a contamination source such as films. As this cleaning method, a cleaning method wherein a processing chamber is disassembled, and films formed in the processing chamber are completely removed is known. This cleaning method, however, has a problem that it requires much time for disassembling, assembling, and starting an apparatus.

In contrast to this, as a conventional film removal method, the following method is known. That is, a gas containing $NF_3$ is fed into a processing vessel as a cleaning gas, and films deposited on a mounting table or the inner surface of the processing vessel are removed by this cleaning gas. According to this cleaning method, since the decomposition property of $NF_3$ itself used in this method is less than desirable, a plasma is utilized. More specifically, an electrode plate is arranged at a position opposing the mounting table in the processing vessel, and a high-frequency voltage is applied across the mounting table and the electrode to produce a plasma. This plasma excites $NF_3$ to activate it, thereby enhancing a cleaning effect. The cleaning method utilizing a plasma such as a $NF_3$ gas has an advantage over the former method in that an apparatus need not be disassembled, thereby excessively shortening a cleaning time. On the other hand, films deposited on portions, on which the plasma is not distributed, e.g., the inner surface of the processing vessel, particularly, the inner surface of a supply head for a processing gas, are peeled during a wafer convey operation. For this reason, film fractions deposited on the bottom portion of the vessel cannot be effectively removed.

In order to more effectively clean the interior of a film forming apparatus, as disclosed in Jpn. Pat. Appln. KOKAI Publication Nos. 64-17857 and 2-77579, it is proposed that a ClF-based gas is used as a cleaning gas. According to a cleaning method using the ClF-based gas, undesired films formed on not only the surface of a mounting table but also the inner surface of a processing gas supply header and the like can be effectively and perfectly removed without using a plasma.

However, when a processing gas is supplied by the conventional method of supplying a processing gas, the processing gas may be liquefied and remain in a mass-flow controller or a valve. For this reason, when cleaning using a plasma of an $NF_3$ gas is performed, since the chemically active NF3 gas as a plasma source may react with a remaining inorganic-based compound, this inorganic-based compound must be removed. The interior of a system is evacuated and exhausted to remove a liquid inorganic-based compound from this portion. In evacuation and exhaust, heat of vaporization is deprived from the inorganic-based compound, and its evaporation is delayed, undesirably requiring a very long time for removing the inorganic-based compound.

On the other hand, when the $ClF_3$ gas is used as a cleaning gas, the $ClF_3$ gas tends to be liquefied because its boiling point is about +17° C. In addition, since $ClF_3$ tends to be deposited on the inner wall of a vessel, the inner wall surface of a processing gas supply header, and the like, the $ClF_3$ gas may be liquefied in a supply system of a cleaning gas to clog the supply system, or the ClF-based gas which is deposited on the wall surface may peel and be entrapped in a film being formed in a film formation process performed after a cleaning operation, thus causing an element defect. When the supply system temporarily clogs due to liquefaction of the gas, the supply system must be evacuated, e.g., half a day, to restore the system, resulting in a decrease in operating efficiency of the apparatus.

SUMMARY OF THE INVENTION

It is an object of the present invention to provide a processing apparatus and a method of supplying a processing gas wherein a processing gas such as a cleaning gas to be supplied into a processing apparatus can be supplied in a constantly stable state without liquefying the processing gas.

It is another object of the present invention to provide a vacuum processing apparatus whose interior can be efficiently, stably, and almost completely cleaned.

It is still another object of the present invention to provide a cleaning method capable of efficiently, stably, and almost completely cleaning the interior of a vacuum processing apparatus using a cleaning gas.

According to the first aspect of the present invention, there is provided a vacuum processing apparatus comprising:

a vacuum processing chamber for processing a target object;

a processing gas supply source for supplying a processing gas by which a process is performed to the target object in the vacuum processing chamber;

a processing gas supply pipe for supplying the processing gas from the processing gas supply source into the vacuum processing chamber; and pressure reducing means for keeping the gas supply pipe at a lower pressure than the atmospheric pressure when the processing gas is to be supplied to the vacuum processing chamber.

According to the second aspect of the present invention, there is provided a method of supplying a processing gas for processing a target object to a vacuum processing chamber for processing the target object, comprising the steps of:

setting a flow path of the processing gas at a lower pressure than the atmospheric pressure; and supplying the processing gas into the processing chamber through the flow path in a low-pressure state.

According to the third aspect of the present invention, there is provided a vacuum processing apparatus comprising:

a vacuum processing chamber for processing a target object;

a processing gas supply system for supplying a processing gas for performing a specific process to the target object into the vacuum processing chamber; and a cleaning gas supply system, arranged independently of the processing gas supply system, for supplying a cleaning gas containing $ClF_3$.

According to the fourth aspect of the present invention, there is provided a vacuum processing apparatus comprising:

a vacuum processing chamber for processing a target object;

a processing gas supply system for supplying a processing gas for processing the target object into the vacuum processing chamber;

a cleaning gas supply system, arranged independently of the processing gas supply system, for supplying a cleaning gas containing $ClF_3$;

a gas feed member for feeding the processing gas and the cleaning gas into the vacuum processing chamber; and heating means for heating the gas feed member.

According to the fifth aspect of the present invention, there is provided a vacuum processing apparatus comprising:

a vacuum processing chamber for processing a target object;

a processing gas supply system for supplying a processing gas for processing the target object into the vacuum processing chamber;

a cleaning gas supply system, arranged independently of the processing gas supply system, for supplying a cleaning gas containing $ClF_3$; and liquefaction-prevention heating means for preventing liquefaction of the cleaning gas by heating the cleaning gas supply system.

According to the sixth aspect of the present invention, there is provided a method for cleaning a vacuum processing apparatus comprising: a vacuum processing chamber for processing a target object; a processing gas supply system for supplying a processing gas for performing a specific process to the target object into the vacuum processing chamber; and a cleaning gas supply system, arranged independently of the processing gas supply system, for supplying a cleaning gas containing $ClF_3$, the method comprising the steps of:

supplying the cleaning gas into the vacuum processing chamber through the cleaning gas supply system; and supplying an inert gas into the vacuum processing chamber when the cleaning gas is to be supplied.

According to the seventh aspect of the present invention, there is provided a vacuum processing apparatus comprising:

a vacuum processing chamber housing a plurality of target objects;

mounting tables, arranged in the vacuum processing chamber, for mounting the plurality of target objects;

processing gas supply units for individually supplying a processing gas onto the respective target objects on the mounting tables; and cleaning gas supply systems connected to the respective processing gas supply units and capable of individually supplying a cleaning gas containing $ClF_3$, wherein the cleaning gas is supplied from an arbitrarily selected processing gas supply unit onto a corresponding mounting table.

According to the eighth aspect of the present invention, there is provided a method for cleaning a vacuum processing apparatus comprising: a vacuum processing chamber housing a plurality of target objects; mounting tables, arranged in the vacuum processing chamber, for mounting the plurality of target objects; processing gas supply units for individually supplying a processing gas onto the respective target objects on the mounting tables; and cleaning gas supply systems connected to the respective processing gas supply units and capable of individually supplying a cleaning gas, the method comprising the steps of:

supporting the target object on at least one of the mounting tables and performing a specific process to the target object; and supplying the cleaning gas from a processing gas supply unit, corresponding to at least one of the mounting tables to which a process is not performed, onto at least one the mounting table.

According to the ninth aspect of the present invention, there is provided a processing apparatus comprising:

a vacuum processing chamber housing a plurality of target objects;

mounting tables, arranged in the vacuum processing chamber, for mounting the plurality of target objects;

processing gas supply units for supplying a processing gas onto the respective target objects on the mounting tables;

cleaning gas supply systems connected to the respective processing gas supply units and capable of supplying a cleaning gas containing $ClF_3$; and cooling means for keeping a wall surface of the vacuum processing chamber at 50° C. or less.

According to the tenth aspect of the present invention, there is provided a vacuum processing apparatus comprising:

a vacuum processing chamber housing a target objects;

a support member, arranged in the vacuum processing chamber, for supporting one target object;

first heating means for heating the target object through the support member;

second heating means for heating a wall surface of the vacuum processing chamber; and a cleaning gas supply system for supplying a cleaning gas containing $ClF_3$ into the vacuum processing chamber.

Note that it is intended that the vacuum processes in the present invention include all processes performed at a pressure lower than the atmospheric pressure.

BRIEF DESCRIPTION OF THE DRAWINGS

FIG. 1 is a view showing a vacuum processing apparatus according to an embodiment of the present invention;

FIG. 2 is a cross-sectional view of the apparatus shown in FIG. 1;

FIG. 4 is a view a multi-chamber processing apparatus in which the vacuum processing apparatus shown in FIG. 1 and the like are incorporated;

FIG. 6 is a sectional view showing a shower header heating means used for the apparatus shown in FIG. 5;

FIG. 8 is a view showing a vacuum processing apparatus according to still another embodiment of the present invention;

FIGS. 11 and 12 are a longitudinal sectional view and a cross-sectional view, respectively, showing other examples of gas dispersion/supply units (shower headers); and FIG. 13 is a graph showing an effect obtained by cooling a gas dispersion/supply unit.

DETAILED DESCRIPTION OF THE PREFERRED EMBODIMENTS

Figure 3:
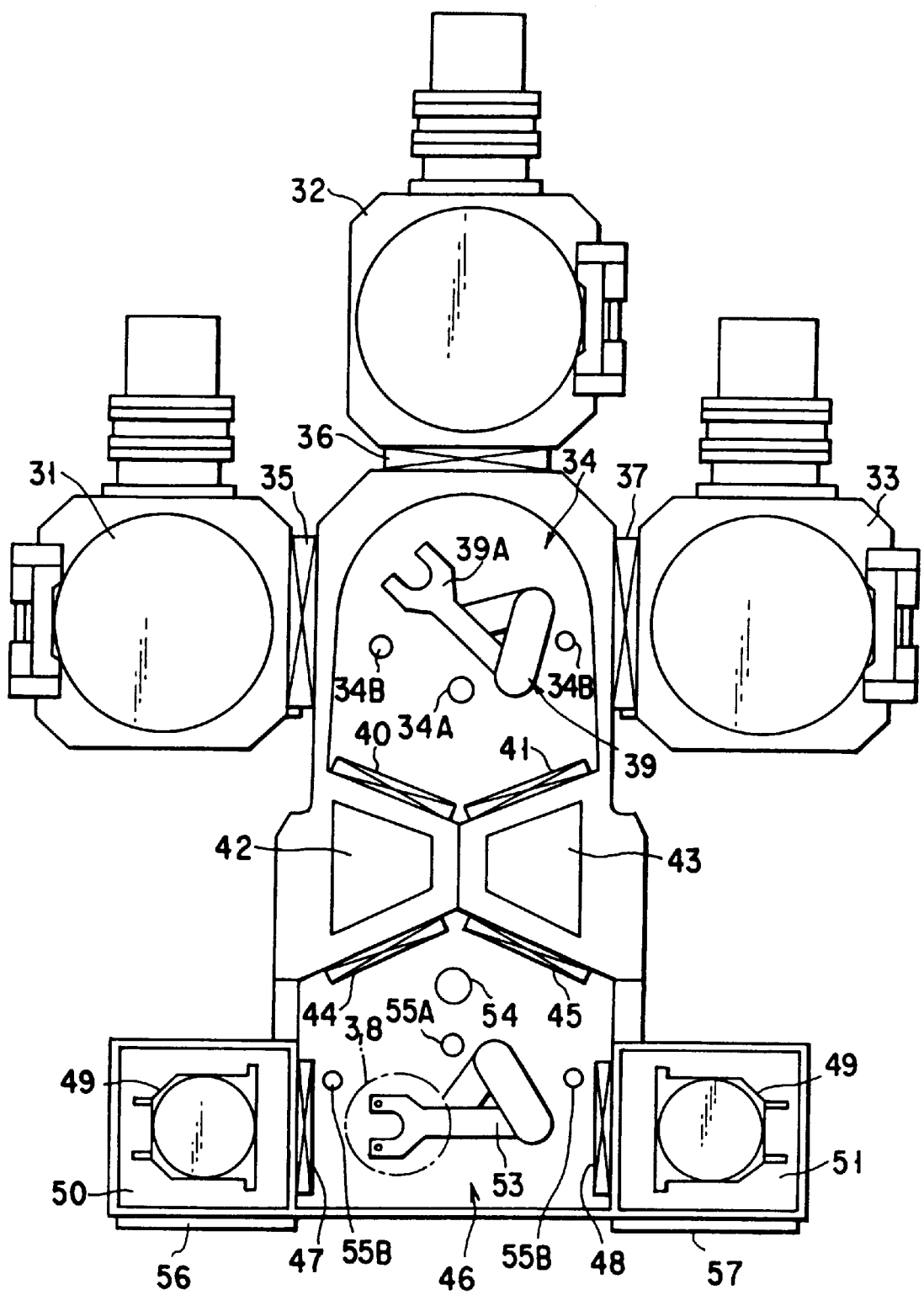
FIG. 3 is a view showing a vacuum processing apparatus according to another embodiment of the present invention.

The present invention will be described in detail below with reference to the accompanying drawings.

FIG. 1 is a view showing a batch type cold wall vacuum processing apparatus to which an embodiment of the present invention is applied. This batch type cold wall processing apparatus has a processing chamber 2 for processing a semiconductor wafer 1 in vacuum. As shown in FIG. 1, the processing chamber 2 has a cylindrical shape and is made of aluminum or the like. A cooling jacket 3 is arranged on the outer surface of the processing chamber 2, and the wall surface of the processing chamber 2 is cooled with water by the cooling jacket 3 to control the temperature of the processing chamber 2 within the range of 0 to 50° C.

A circular rotary member 4 is rotatably horizontally arranged on a bottom wall 2A of the processing chamber 2 using a shaft 7 extending from the bottom wall 2A as a center. Susceptors 5, e.g., eight as shown in FIG. 2, are mounted on this circular rotary member 4 at equal intervals therebetween in a circumference direction, and the susceptors 5 serve as support members for horizontally supporting the semiconductor wafers 1 one by one.

Each susceptor 5 has a disk-like shape and is arranged to slightly project from the rotary member 4. A heating resistor 6 is buried at a position below each susceptor 5 of the rotary member 4, and each susceptor 5 is individually heated by the heating resistor 6.

The hollow shaft 7 arranged at the central position of the rotary member 4 downwardly extends through the bottom wall 2A of the processing chamber 2 from the surface of the rotary member 4. A gear 8 is mounted on the lower portion of the shaft 7. In addition, a gear 9A mounted on a rotating shaft 9B of a drive motor 9 engages with the gear 8. Therefore, the rotary member 4 is rotated in a direction indicated by each of arrows shown in FIGS. 1 and 2 by a rotational force transmitted through the rotating shaft 9B and a gear 9A of the drive motor 9, the gear 8, and the shaft 7.

On the other hand, gas dispersion/supply units 10 are arranged to oppose the respective susceptors 5 above the respective susceptors 5. A processing gas or a cleaning gas is supplied from these gas dispersion/supply units 10 as will be described later. Each gas dispersion/supply unit 10 has a disk-like hollow shape. A gas supply pipe 10A is connected to the center of the upper surface of each gas dispersion/supply unit 10, and a large number of gas supply holes 10B are formed in the lower surface thereof. As shown in FIG. 1, a processing gas supply system 11 for supplying a processing gas is connected to the gas supply pipe 10A of each gas dispersion/supply unit 10 through a pipe 12, and the predetermined processing gas is supplied into the processing chamber 2 through the gas dispersion/supply units 10 by opening a valve 13 connected to the pipe 12.

For example, when a blanket W process is to be performed in the processing chamber 2, tungsten hexafluoride ($WF_6$) and hydrogen are supplied as a processing gas from the processing gas supply system 11 to the gas dispersion/supply units 10, and the processing gas is uniformly supplied onto the semiconductor wafer 1 on the susceptor 5 in the processing chamber 2 through gas supply holes 10B formed in the lower surface of each gas dispersion/supply unit 10, thereby forming a W film on the surface of the semiconductor wafer 1 using thermal CVD.

This processing gas supply system 11 comprises a $WF_6$ gas bomb 11A for storing a $WF_6$ gas serving as a processing gas and a hydrogen gas bomb 11B for storing a hydrogen gas used for reducing this $WF_6$ gas. These gas bombs 11A and 11B are connected to the end portions of pipes 12A and 12B branched from the pipe 12, respectively.

A pressure reducing valve 11C, a mass-flow controller 11D, and a valve 11E are sequentially connected to the pipe 12A, to which the $WF_6$ gas bomb 11A is connected, from the upstream side to the downstream side. A valve 11F, a mass-flow controller 11G, and a valve 11H are sequentially connected to the pipe 12B, to which the $WF_6$ gas bomb 11B is connected, from the upstream side to the downstream side. The gases from these gas bombs 11A and 11B are mixed with each other in the pipe 12, and the processing gas is supplied into the processing chamber 2 through the pipes 12 and 10A by opening the valve 13.

More specifically, the pressure of liquid $WF_6$ in the $WF_6$ bomb 11A is temporarily reduced by the pressure reducing valve 11C. The flow rate of the $WF_6$ gas at a reduced pressure is adjusted by the mass-flow controller 11D, and the $WF_6$ gas is mixed with the hydrogen gas whose flow rate is adjusted in the same manner at a predetermined ratio.

As shown in FIG. 1, a cleaning gas supply system 14 for supplying a cleaning gas is connected to the pipe 12 through a pipe 15, and the cleaning gas is supplied from the cleaning gas supply system 14 onto each susceptor 5 in the processing chamber 2 through the pipe 15, the pipe 12, and each gas dispersion/supply unit 10 during cleaning. That is, these gas dispersion/supply units 10 serve as units for supplying also the cleaning gas to the processing chamber 2.

The cleaning gas supply system 14 comprises a $ClF_3$ gas bomb 16 for storing a $ClF_3$ gas serving as a cleaning gas and a nitrogen gas bomb 17 for storing a dilution gas, e.g., a nitrogen gas, for diluting the $ClF_3$ gas. These gas bombs 16 and 17 are connected to the end portions of pipes 15A and 15B branched from the pipe 15, respectively.

A pressure reducing valve 18, a mass-flow controller 19, and a valve 20 are sequentially connected to the pipe 15A, to which the $ClF_3$ gas bomb 16 is connected, from the upstream side to the downstream side. A valve 21, a mass-flow controller 22, and a valve 23 are sequentially connected to the pipe 15B, to which the nitrogen gas bomb 17 is connected, from the upstream side to the downstream side. The gases from these gas bombs 16 and 17 are mixed with each other in the pipe 15, and the cleaning gas is supplied into the processing chamber 2 through the pipes 15, 12, and 10A by opening a valve 24.

More specifically, the pressure of liquid $ClF_3$ in the $ClF_3$ bomb 16 is temporarily reduced by the pressure reducing valve 18. The flow rate of the gasified $ClF_3$ gas at a reduced pressure is adjusted by the mass-flow controller 19, and the $ClF_3$ gas is mixed with the nitrogen gas whose flow rate is adjusted in the same manner at a predetermined ratio.

The gases supplied from the gas dispersion/supply units 10 into the processing chamber 2 are exhausted outside the processing chamber 2 through an exhaust pipe 25 inserted in the rotating shaft 7 of the rotary member 4. A vacuum pump 26 is mounted on the downstream side of the exhaust pipe 25. The processing chamber 2 is evacuated by the vacuum pump 26, and the processing chamber 2 is set at a predetermined degree of vacuum. Therefore, the exhaust pipe 25 also serves as a unit for exhausting the cleaning gas from the processing chamber 2.

As the vacuum pump 26, an oil-free dry pump is preferably used not to be affected by the exhausted gas. In addition, a toxicity-removing unit 27 for catching toxic gases such as the processing gas and cleaning gas exhausted from the vacuum exhaust pump 26 to remove these toxic gases from the exhausted gas is arranged on the downstream side of the vacuum exhaust pump 26. As the toxicity-removing unit 27, a unit filled with a solvent, e.g., an alkaline solution for easily dissolving $ClF_3$, is used.

In the above batch type cold wall processing apparatus, the susceptors 5 are kept at a ground potential. A high-frequency power supply 28 is connected to the gas dispersion/supply units 10 opposing to the susceptors 5. When a high-frequency voltage is applied to each gas dispersion/supply unit 10 by the high-frequency power supply 28, a high-frequency electric field is formed between each gas dispersion/supply unit 10 and each susceptor 5.

Therefore, the processing chamber 2 is exhausted by the vacuum pump 26, and the processing gas is fed from each gas dispersion/supply unit 10 to the processing chamber 2 while the processing chamber 2 is held at a predetermined degree of vacuum. In this state, when a high-frequency voltage is applied to each gas dispersion/supply unit 10 by the high-frequency power supply 28, vacuum discharge occurs between the susceptor 5 and the gas dispersion/supply unit 10, both of which constitute a pair of electrodes, and the processing gas is converted into a plasma therebetween, thereby forming a predetermined film on the surface of the semiconductor wafer 1 heated on the susceptor 5 by this plasma. That is, this batch type cold wall processing apparatus is constituted to be used as not only a thermal CVD processing apparatus but also a plasma CVD processing apparatus.

Note that, in FIG. 1, reference numeral 29 denotes a gate valve mounted on a loading/unloading port of the processing chamber 2. The processing chamber 2 is connected to a convey chamber 30, as shown in FIG. 2, through the gate valve 29. The convey chamber 30 is used for shielding the interior of the processing chamber 2 from the atmosphere when the semiconductor wafer 1 is loaded/unloaded in/from the processing chamber 2.

A film formation process by blanket w by thermal CVD using the above batch type cold wall processing apparatus will be described below. After the processing chamber 2 is evacuated by the vacuum pump 26 so that the processing chamber 2 is set at a predetermined degree of vacuum, the $WF_6$ gas and hydrogen are supplied as a processing gas from the processing gas supply system 11.

At this time, in this embodiment, the interior of the pipe 12A of the processing gas supply system 11 is set at a reduced pressure, e.g., at a pressure of 600 Torr or less, to gasify liquid $WF_6$. Thereafter, this $WF_6$ gas is supplied into the processing chamber 2 through the pipe 12A at a reduced pressure. For this reason, the $WF_6$ gas is not liquefied in the processing gas supply system 11.

The $WF_6$ gas and hydrogen mixed with each other in the processing gas supply system 11 at a predetermined ratio are supplied to each gas dispersion/supply unit 10 as a processing gas. The gas mixture is uniformly supplied from dispersion holes 10B in the lower surface of each gas dispersion/supply unit 10 onto the semiconductor wafer 1 on each susceptor 5 in the processing chamber 2. At this time, the semiconductor wafer 1 supported by each susceptor 5 is heated to a predetermined temperature by heating operation of the heating member 6. For this reason, when the processing gas is brought into contact with the heated semiconductor wafer 1 and obtains its thermal energy, reduction of $WF_6$ with hydrogen occurs, thereby forming a tungsten film on the surface of the semiconductor wafer 1. With this process, tungsten films are also formed on other portions, e.g., the susceptors 5.

When a blanket W process is performed by plasma CVD using the above batch type cold wall processing apparatus, the semiconductor wafer 1 is supported by each susceptor 5 in the processing chamber 2 which is set at a predetermined degree of vacuum by the vacuum pump 26, and the semiconductor wafer 1 on the susceptor 5 is heated to a temperature of 300 to 400° C. by the heating member 6. In parallel with this process, the valve 13 of the processing gas supply system 11 is opened to supply the gas mixture of the $WF_6$ gas and the hydrogen gas at a predetermined ratio from the open valve 13 into the processing chamber 2 through the pipe 12 and the gas dispersion/supply units 10 in the same manner as described above. At this time, when a high-frequency voltage is applied to the gas dispersion/supply units 10 by the high-frequency power supply 28, vacuum discharge occurs between the susceptors 5 and the gas dispersion/supply units 10. A plasma of the $WF_6$ gas and the hydrogen gas is generated between the susceptors 5 and the gas dispersion/supply units 10 by this vacuum discharge, and $WF_6$ is reduced to form a tungsten film on the surface of the semiconductor wafer 1. With this process, tungsten films are also formed on other portions, e.g., the susceptors 5.

Films are formed on the inner surface of the processing chamber 2, the susceptors 5, and other portions of the processing chamber 2 in this film formation process. When the film formation process is repeated a predetermined number of times, these films are stacked, and these films are eventually peeled to form particles. These particles float in the chamber to contaminate the cleaned semiconductor wafer 1 as described above. These particles are gradually deposited on the bottom surface of the processing chamber 2 and float in loading/unloading the semiconductor wafer 1. Consequently, the semiconductor device 1 is undesirably contaminated by these particles.

After the film formation process is performed several times, the film formation process is temporarily interrupted, and the processing chamber is cleaned by supplying a cleaning gas thereinto, thereby removing dust such as particles or the like. In this embodiment, the power supply for heating members 6 and the like of the processing chamber 2, is turned off, and a state wherein no semiconductor wafer 1 is present in the processing chamber 2 is kept. Then, after the gate valve 29 is closed and the processing chamber 2 is isolated from the outer circumstance, the $ClF_3$ gas (containing a dilution gas such as a nitrogen gas depending on applications) is supplied as the cleaning gas from the cleaning gas supply system 14 onto the susceptors 5 in the processing chamber 2 through pipes 15 and 12, and the respective gas dispersion/supply units 10 as indicated by an arrow in FIG. 1, thereby performing cleaning.

When this cleaning is to be performed, a processing gas in the system is substituted with, e.g., nitrogen. In this embodiment, since the interior of the system is constantly at a reduced pressure so as not to liquefy $WF_6$, and then the processing gas is supplied, the $WF_6$ gas in the system can be easily evacuated and exhausted. In particular, since the $WF_6$ gas is not liquefied in the pipe 12A, the mass-flow controller 11C, and the valve 11E of the process supply system 11 at a reduced pressure, the processing gas can be substituted with nitrogen within a very short time.

As described above, after the gate valve 29 is closed to disconnect the processing chamber 2 from the convey chamber 30, the cleaning gas is supplied from the cleaning gas supply system 14 into the processing chamber 2 through the gas dispersion/supply units 10. Deposits such as films deposited on the interior of the processing chamber 2 are cleaned by the cleaning gas while the cleaning gas is exhausted outside the chamber by the vacuum pump 26 through the exhaust pipe 25 of the processing chamber 2. The cleaning gas is constituted as a $ClF_3$ gas or a gas containing a $ClF_3$ gas and a dilution gas such as a nitrogen gas. $ClF_3$ is chemically active and reacts with, particularly, a metal-based or nonmetal-based film, thus effectively removing these deposits.

When the $ClF_3$ gas constituting the cleaning gas is supplied in this manner, the same supplying method as that of supplying the processing gas in the above film formation can be applied.

More specifically, in the cleaning, the vacuum pump 26 is driven at a temperature higher than a boiling point of $ClF_3$, e.g., room temperature, and the hydrogen gas is exhausted from the processing chamber 2 to keep the processing chamber 2 at a predetermined degree of vacuum. While this exhaust state is kept, $ClF_3$ is gasified by the pressure reducing valve 18 of the cleaning gas supply system 14, and the valve 20 is opened at a predetermined degree of opening. In addition, the $ClF_3$ gas is supplied into the processing chamber 2 through the pipe 15 by the mass-flow controller 19 at a predetermined flow rate, e.g., 5 l/min. or less. The cleaning gas is fed into the is processing chamber 2 through each gas dispersion/supply unit 10 connected to the pipe 15. The pressure of the $ClF_3$ gas is kept at 0.1 to 100 Torr in the processing chamber 2.

In this case, the processing chamber 2 is cleaned in a state wherein the cleaning gas spreads in all the processing chamber 2. Moreover, the consumed cleaning gas is constantly exhausted from the exhaust pipe 25 of the processing chamber 2 through the exhaust system such as the vacuum pump 26, thereby replenishing the fresh cleaning gas. During cleaning, while a fresh cleaning gas is constantly filled in the processing chamber 2, the pressure of the processing chamber 2 is kept at 0.1 to 100 Torr. Therefore, all of interior of the processing chamber 1 can be efficiently cleaned.

Since the cleaning gas is exhausted outside the chamber through the exhaust pipe 25, the exhaust pipe 25 on which films of reaction products are easily formed can be cleaned by the cleaning gas in the same manner as in the processing chamber 2 so as to remove the films. Since toxic gasses exhausted from the exhaust system can be removed by the toxicity removing unit 27, clean exhaustion can be performed.

Since the $ClF_3$ gas supplied into the processing chamber 2 is a chemically active gas, the $ClF_3$ gas reacts with deposits such as metal-based or silicon-based films, thereby removing deposits in the processing chamber 2. Therefore, the interior of the processing chamber 2 can be cleaned. Even if metal-based or silicon-based particles are deposited in the processing chamber 2, the $ClF_3$ gas spreads in all the chamber to perfectly remove, by the $ClF_3$ gas, the particles and the like deposited on not only the inner surface of the processing chamber 2 but also the susceptors 5 in the chamber. In addition, since the reaction between the $ClF_3$ gas and the films or the like is a exothermic reaction, this heat generation more accelerates the reaction of the $ClF_3$ gas, so that deposits such as films can be effectively removed.

When the $ClF_3$ gas is supplied as the cleaning gas in this manner, the same method as that applied to the gas for a film formation process described above is applied so as to supply the $ClF_3$ gas into the processing chamber 2 without being liquefied in the cleaning gas supply system 14. In the subsequent film formation process, the $ClF_3$ gas can be substituted within a short time.

When the cleaning gas, e.g., only the $ClF_3$ gas, is supplied into the processing chamber 2, cleaning is preferably performed under the following conditions: the flow rate of the $ClF_3$ gas is set to be 5 l/min. or less; the temperature of $ClF_3$ is set to be the boiling point of $ClF_3$ to 700° C.; and the internal pressure is set to be 0.1 to 100 Torr. When the flow rate of the $ClF_3$ gas exceeds 5 l/min., the constituent members constituting the chambers may be damaged. When the temperature of the $ClF_3$ gas is lower than the boiling point, condensation of $ClF_3$ occurring on the constituent members may damage the constituent members. When the temperature exceeds 700° C., the $ClF_3$ gas is activated, and the constituent members may be damaged. When the pressure of the $ClF_3$ gas is less than 0.1 Torr, a cleaning effect may not be expected; when the pressure exceeds 100 Torr, the constituent members may be damaged.

As has been described above, according to this embodiment, in a blanket W process, when liquid $WF_6$ is supplied as a $WF_6$ gas from the $WF_6$ gas bomb 11A of the process supply system 11 into the processing chamber 2 through the pipe 12A, $WF_6$ is gasified in a state wherein the interior of the pipe 12A is kept at a reduced pressure lower than the atmospheric pressure by the pressure reducing valve 11C. Thereafter, this $WF_6$ gas is supplied into the processing chamber 2 through the pipe 12A at a reduced pressure so that the $WF_6$ gas can be stably supplied without being liquefied in the mass-flow controller 11D and the valve 11E. Therefore, a process can be stably performed. In addition, the $WF_6$ is not liquefied in the mass-flow controller 11D and the valve 11E. For this reason, when the interior of the processing chamber 2 is to be cleaned by the $ClF_3$ gas without disassembling the processing chamber 2, the $WF_6$ gas can be substituted with the $ClF_3$ gas in a very short time, thereby extremely shortening a cleaning time.

Moreover, since supply of the cleaning gas is performed in the same manner as in the above case wherein the processing gas is supplied, cleaning can be stably performed without liquefying the cleaning gas. In addition, since this supplying method is applied, when the subsequent process is to be started upon completion of cleaning by the $ClF_3$ gas, the $ClF_3$ gas can be substituted with a gas in a very short time, and the next process can be started in a short time.

The method of supplying a processing gas, which is applied to this embodiment, can be applied to a multi-chamber vacuum processing apparatus, having a plurality of vacuum processing chambers, such as a cluster tool type vacuum processing apparatus shown in FIG. 3. This multi-chamber processing apparatus is incorporated with a film formation unit, e.g., the above batch type cold wall processing unit or the like. The multi-chamber processing apparatus can continuously perform film formation processes in parallel with other processes in the same vacuum system.

A cluster tool type vacuum processing apparatus comprises one common vacuum convey chamber; a plurality of vacuum processing chambers radially arranged around the common vacuum convey chamber; a gate valve, arranged between the common vacuum convey chamber and each of the plurality of vacuum processing chambers, for isolating or communicating them; and a convey mechanism of a target object arranged in the common convey chamber. The target object conveyed by this convey means is sequentially loaded in the vacuum processing chamber in accordance with a predetermined order, and a specific vacuum process is performed with respect to the target object.

As shown in FIG. 3, this multi-chamber processing apparatus comprises three processing chambers 31, 32, and 33, and at least one of these processing chambers is constituted by the above batch type cold wall processing unit. These processing chambers 31, 32, and 33, as shown in FIG. 3, are connected to three side surfaces of a first convey chamber 34 having an almost rectangular shape through gate valves 35, 36, and 37, respectively. The processing chambers 31, 32, and 33 communicate with the first convey chamber 34 by opening these gate valves 35, 36, and 37, respectively, and are disconnected from the first convey chamber 34 by closing these gate valves 35, 36, and 37, respectively.

The first convey chamber 34 has a convey unit 39 and, the convey unit 39 conveys a target object, e.g., a semiconductor wafer 38, to the processing chambers 31, 32, and 33. The first convey chamber 34 is designed to have the degree of vacuum almost equal to that of each of the processing chambers 31, 32, and 33. This convey unit 39 is arranged at an almost central position in the first convey chamber 34, and has a multi-joint arm 39A. The multi-joint arm 39A places the semiconductor wafer 38 on the hand of the multi-joint arm 39A to convey the semiconductor wafer 38.

As shown in FIG. 3, a gas supply port 34A is formed as a gas supply portion in the bottom surface of the first convey chamber 34, and connected to a cleaning supply system 14 for supplying a cleaning gas. Gas exhaust ports 34B are also formed in the bottom surface of the first convey chamber 34, and the cleaning gas supplied from the gas supply ports 34 is exhausted from the gas exhaust ports 34B.

Two preliminary vacuum chambers 42 and 43 are arranged to be able to communicate with the remaining side surface of the first convey chamber 34 through gate valves 40 and 41, respectively. The preliminary vacuum chambers 42 and 43 communicate with the first convey chamber 34 by opening the gate valves 40 and 41, respectively, and are disconnected from the first convey chamber 34 by closing the gate valves 40 and 41, respectively.

Therefore, when the semiconductor wafer 38 is transferred by the first convey unit 39 from, e.g., the preliminary vacuum chamber 42 to a predetermined processing chamber in a predetermined vacuum atmosphere, a predetermined film formation process is performed to the semiconductor wafer 38 in this processing chamber, and the processed semiconductor wafer 38 is sequentially transferred by the convey unit 39 to other processing chambers. After predetermined processes in these processing chambers are completed, the semiconductor wafer 38 can be transferred into the other preliminary vacuum chamber 43 again.

Gate valves 44 and 45 are arranged at portions opposing the gate valves 40 and 41 of the preliminary vacuum chambers 42 and 43, respectively. The preliminary vacuum chambers 42 and 43 are connected to a second convey chamber 46 through the gate valves 44 and 45, and the preliminary vacuum chambers 42 and 43 communicate with the second convey chamber 46 by opening the gate valves 44 and 45, and are disconnected from the second convey chamber 46 by closing the gate valves 44 and 45.

Cassette chambers 50 and 51 for storing cassettes 49 are connected to both the left and right side surfaces of the second convey chamber 46 through gate valves 47 and 48. The cassette chambers 50 and 51 communicate with the second convey chamber 46 by opening the gate valves 47 and 48, respectively, and are disconnected from the second convey chamber 46 by closing the gate valves 47 and 48, respectively.

In the second convey chamber 46, a second convey unit 53 is arranged at the central position between the left and right cassette chambers 50 and 51. The semiconductor wafer 38 is conveyed by a multi-joint arm 53A of the second convey unit 53 between the preliminary vacuum chambers 42 and 43 and the cassette chambers 50 and 51.

A positioning mechanism 54 for optically positioning the semiconductor wafer 38 with reference to the orientation flat of the semiconductor wafer 38 is arranged between the second convey unit 53 and the preliminary vacuum chambers 42 and 43. After the semiconductor wafer 38 is temporarily positioned by the positioning mechanism 54, the semiconductor wafer 38 is conveyed by the second convey unit 53 into the preliminary vacuum chamber 42.

The second convey chamber 46 has a pressure adjustment unit (not shown) for supplying an inert gas such as a nitrogen gas into the second convey chamber 46 and adjusting and holding the pressure of the inert gas at the atmospheric pressure. The second convey chamber 46 is set, by this pressure adjustment unit, in a nitrogen gas atmosphere having atmospheric pressure. In this state, the semiconductor wafer 38 is conveyed between the cassettes 49 in the cassette chambers 50 and 51 and the preliminary vacuum chambers 42 and 43. The second convey chamber 46 is kept at a predetermined degree of vacuum during cleaning.

A gas supply port 55A is formed on the bottom surface of the second convey chamber 46, and the gas supply port 55A is connected to the cleaning gas supply system 14 for supplying a cleaning gas through a pipe (not shown). The cleaning gas supplied from the gas supply port 55A is exhausted from gas exhaust ports 55B formed in the bottom surface of the second convey chamber 46. These gas exhaust ports 55B are connected to exhaust system valves (not shown) of the preliminary vacuum chambers 42 and 43, and the second convey chamber 46 is evacuated through the exhaust ports 55B using the exhaust systems during cleaning. While cleaning is not performed, these valves are kept closed, and only the preliminary vacuum chambers 42 and 43 are evacuated.

Reference numerals 56 and 57 denote gates arranged on the front surfaces of the cassette chambers 50 and 51, respectively.

When the processing gas is to be supplied into the respective processing chambers 31, 32, and 33 of such a multi-chamber processing apparatus, the processing gas can be stably supplied into the respective processing chambers 31, 32, and 33 by applying such a method of supplying a processing gas according to the present invention. In addition, the series of processes can be accurately performed, thereby increasing the yield of products.

Although the $WF_6$ gas and the $ClF_3$ gas are used as a processing gas in the above example, other gases for film formation processing gas and other gases for cleaning process can be applied. Furthermore, in the above example, the pressure of the $WF_6$ gas or the $ClF_3$ gas is reduced by the pressure reducing valve 11C or 18 to gasify the source. However, this embodiment is not limited to the above example. For example, the embodiment of using the valves is simply described on the basis of illustrations, and various types of embodiments of using them can be applied as needed. In the above example, this embodiment is applied to the batch type cold wall processing unit. However, the present invention can be applied to all units wherein a target object is processed by supplying a processing gas.

Another embodiment which uses a slightly deformed processing apparatus of the apparatus described above will be described below.

A processing apparatus of this embodiment has the same basic arrangement as that of the apparatus shown in FIG. 1, the same reference numerals as in FIG. 1 denote the same parts in this embodiment, and a detailed description thereof will be omitted.

In this apparatus, gas mixing units 10C for mixing a plurality of gases are connected to the center of upper surface of each dispersion/supply unit 10. A processing gas supply system 11 for supplying a processing gas is connected to each gas mixing unit 10C through a pipe 12 as shown in FIG. 4. This pipe 12 is branched so as to divide the flow of a processing gas to the eight gas dispersion/supply units. Valves 13A and 13B are mounted on branched pipes, e.g., branched pipes 12A and 12B, respectively, as shown in FIG. 4. In addition, the branched pipes 12A and 12B are connected to gas mixing units 10C at the downstream sides of the valves 13A and 13B, respectively. The processing gas is sufficiently mixed in each gas mixing unit 10C. Therefore, when the processing gas is to be supplied into a processing chamber 2, the processing gas can be supplied into the processing chamber through the arbitrarily selected gas dispersion/supply units 10 by individually operating the respective valves 13A and 13B.

A cleaning gas supply system 14 for supplying a cleaning gas is connected to the gas mixing unit 10A of each gas dispersion/supply unit 10 through a pipe 15 as shown in FIG. 4. In cleaning, the cleaning gas is supplied from the cleaning gas supply system 14 onto each susceptor 5 in the processing chamber 2 through the pipe 15, the gas mixing unit 10C, and each gas dispersion/supply unit 10.

The pipe 15 is branched at the downstream side of a valve 24 so as to divide the flow of the cleaning gas to the eight gas dispersion/supply units 10. As shown in FIG. 4, valves 24C and 24D are mounted on branched pipes, e.g., branched pipes 15C and 15D, respectively. In addition, the branched pipes 15C and 15D are connected to gas mixing units 10C of the gas dispersion/supply units 10 at the downstream sides of the valves 24A and 24B, respectively. Therefore, when the cleaning gas is to be supplied into the processing chamber 2, the cleaning gas can be supplied into the processing chamber 2 through the arbitrarily selected gas dispersion/supply units 10 by individually operating the respective valves 24C and 24D. Still further, the valves 24C and 24D for the cleaning gas may be integrated to constitute a three-way valve, and the valves 13A and 13B for the processing gas may be integrated to constitute a three-way valve. The cleaning gas and the processing gas can be properly selected by switching the three-way valve, thereby supplying the selected gas into the processing chamber 2.

With this arrangement, after a film formation process is performed several times, a $ClF_3$ gas (containing a dilution gas depending on applications) is supplied as a cleaning gas from the arbitrarily selected gas dispersion/supply units 10 onto the susceptors 5 corresponding to these units 10 during processing a semiconductor wafer 1, and deposits deposited on the susceptors 5 and in the vicinity thereof are cleaned by this cleaning gas in parallel with the process of the semiconductor wafer 1 without interrupting the process.

While the semiconductor wafer 1 is processed in this manner, the $ClF_3$ gas is supplied as the cleaning gas from the arbitrarily selected gas dispersion/supply units 10 onto the susceptors 5 corresponding to these units 10, and deposits deposited on the susceptors 5 and in the vicinity thereof are cleaned by the cleaning gas in parallel with the process of the semiconductor wafer 1. Therefore, metal-based and silicon-based deposits deposited on the bottom and inner surfaces of the processing chamber 2 and the susceptors 5 can be perfectly cleaned without excessively decreasing production efficiency because cleaning is repeated during the film formation process of the semiconductor wafer 1.

Still another embodiment of the present invention will be described below.

Figure 5:
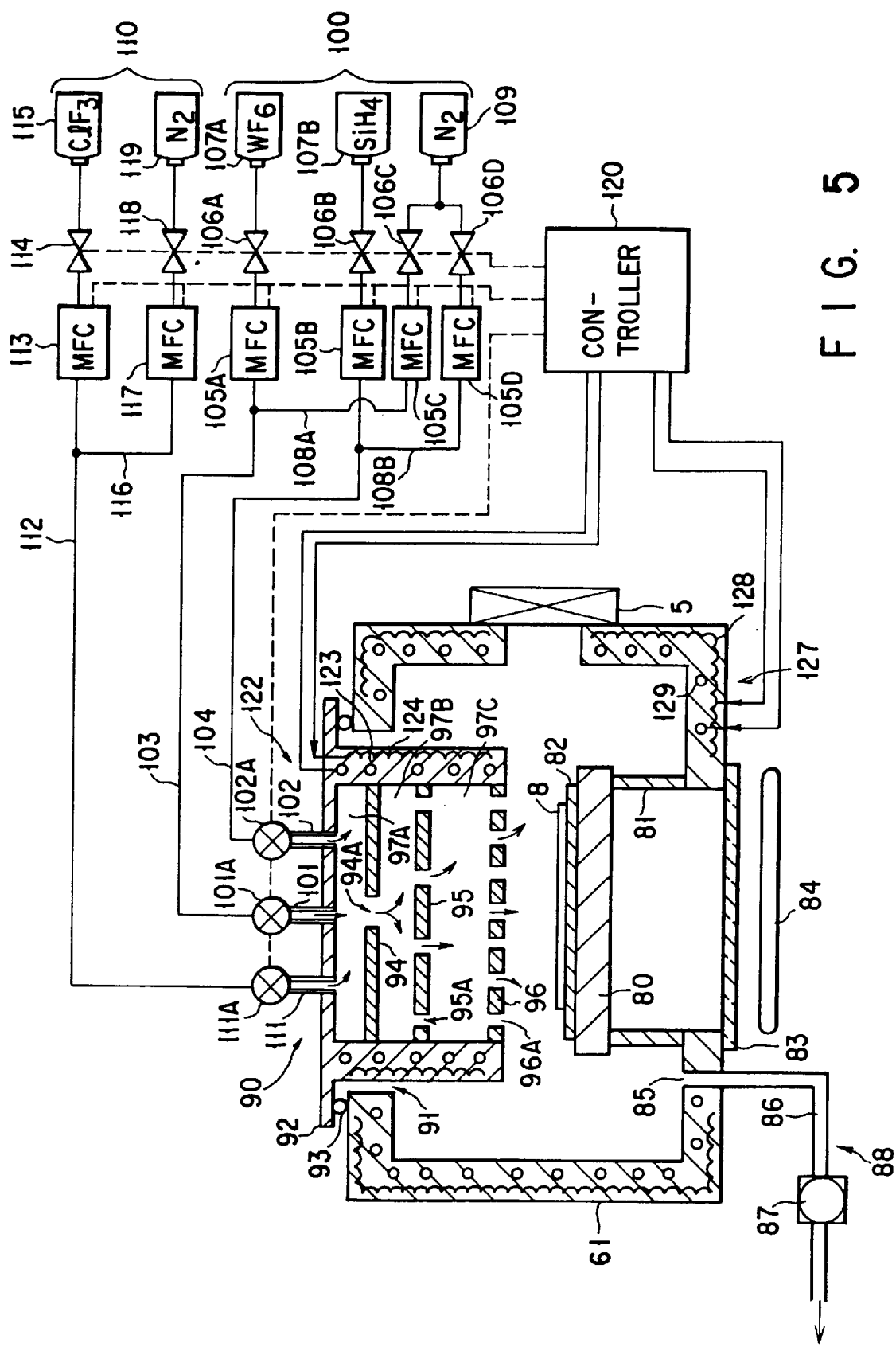
FIG. 5 is a view showing a vacuum processing apparatus according to still another embodiment of the present invention.

FIG. 5 is a view showing a processing apparatus according to this embodiment.

This processing apparatus is a thermal CVD apparatus for forming a metal film, e.g., a tungsten film. A processing chamber 61 of this processing apparatus has an almost cylindrical shape and is formed of, e.g., aluminum, and the processing chamber 61 can be kept at a predetermined degree of vacuum. A gate valve 71 is arranged on one side wall of the processing chamber 61, and a convey chamber and the like are connected to one side wall of the processing chamber 61 through the gate valve 71.

In the processing chamber 61, a susceptor 80 which consists of, e.g., aluminum, and places a wafer 1 thereon is supported by a support cylinder 81 vertically arranged from the bottom wall of the processing chamber 61. An electrostatic chuck 82 connected to a DC power supply (not shown) is arranged on the upper surface of the susceptor 80, and the electrostatic chuck 82 electrostatically attracts the wafer 1 thereon.

A portion, of the bottom surface of the processing chamber 61, corresponding the lower portion of the susceptor 80 is open, and a quartz window 83 is airtightly arranged on this opening portion. A heating halogen lamp 84 is arranged under the window 83. During a film formation process, light from the halogen lamp 84 passes through the window 83 and illuminates the lower surface of the susceptor 80, and this optical energy indirectly heats the wafer 1 to a predetermined process temperature.

An exhaust port 85 is formed in the bottom portion of the processing chamber 61, an exhaust pipe 86 is connected to this exhaust port 85, and the exhaust pipe 86 is connected to a vacuum pump 87, thereby constituting an exhaust system 88. The processing chamber 61 is evacuated by the exhaust system 88 as needed.

On the other hand, a mounting hole 91 which has, e.g., a circular shape, and is to mount a shower header 90 is formed in the ceiling portion of the processing chamber 61. The shower header 90 having a cylindrical shape and consisting of, e.g., aluminum, is inserted in the mounting hole 91. A flange portion 92 is formed at the peripheral portion of the header 90, and this flange portion 92 is supported by the ceiling portion of the processing chamber 61 through an O-ring 93. In this state, the header 90 is airtightly arranged in the processing chamber 61.

A processing gas supply system 100 for supplying a processing gas and a cleaning gas supply system 110 for supplying a ClF-based gas such as a ClF, $ClF_3$, or $ClF_5$ gas as a cleaning gas are individually connected to the upper portion of the shower header 90.

In this shower header 90, a partition plate 94, a diffusion plate 95, and a straightening plate 96 are sequentially horizontally arranged from the upper direction. The shower header 90 is partitioned into three chambers 97A, 97B, and 97C by the plates 94, 95, 96.

One communication hole 94A is formed at the central position of the partition plate 94, a plurality of diffusion holes 95A are formed and distributed in the entire surface of the diffusion plate 95. A large number of flow-uniforming holes 96A are formed and distributed in the entire surface of the straightening plate 96.

In this case, the diameter of each of the diffusion holes 95A is set within the range of about 0.2 to 1.5 mm, and the diffusion holes 95A are distributed at a low density. However, the diameter of each of the flow-uniforming holes 96A is set within the range of about 0.5 to 2.0 mm which is larger than that of each of the diffusion holes 95A, and the flow-uniforming holes 96A are distributed at a high density. When the diameters and distributions of the holes are changed, the pressures of the vertically arranged chambers are different from each other. For this reason, a plurality of processing gases which are locally fed are uniformly mixed with each other, and uniformly supplied onto the wafer surface. Therefore, when the diameter of the wafer 8 is about 200 mm, the diameter of the straightening plate 96 is set to be a value, e.g., about 220 to 230 mm, which is slightly larger than that of the wafer 8. Note that the number of diffusion plates 95 or straightening plates 96 may be further increased such that a plurality of stages are formed by the diffusion plates 95 or the straightening plates 96.

The inner/outer surfaces of the shower header 90, the partition plate 94, the diffusion plate 95, the straightening plate 96, and the inner surface of the processing chamber 61 are subjected to a surface polishing process to prevent a ClF-based gas from being deposited on the inner/outer surfaces of the shower header 90, the partition plate 94, the diffusion plate 95, the straightening plate 96, and the inner surface of the processing chamber 61.

As a tungsten film is formed in this embodiment, the processing gas supply system 100 has first and second processing gas feed ports 101 and 102 connected to the shower header 90 for feeding two types of gases, and first and second port opening/closing valves 101A and 102A are connected to the processing gas feed ports 101 and 102, respectively. First and second processing gas feed pipes 103 and 104 respectively connected to the first and second processing gas feed ports 101 and 102 are connected to first and second processing gas sources 107A and 107B through first and second mass-flow controllers 10SA and 105B and first and second opening/closing valves 106A and 106B, respectively. In this embodiment, a $WF_6$ gas is used as the first processing gas, and any one of $H_2$, $Si_2H_4$, and $Si_2H_6$ gases is used as the second processing gas. In this embodiment, the $SiH_4$ gas is used.

Branched pipes 108A and 108B are arranged midway along the first and second processing gas feed pipes 103 and 104, respectively. Third and fourth mass-flow controllers 105C and 105D and third and fourth opening/closing valves 106C and 106D are connected midway along the branched pipes 108A and 108B, respectively, and the branched pipes 108A and 108B are commonly connected to a first nitrogen source 109 serving as an inert gas source. As will be described later, a nitrogen gas serving as an inert gas is supplied from this nitrogen source 109 during cleaning.

On the other hand, the cleaning gas supply system 110 has a cleaning gas feed port 111 connected to the shower header 90, and a cleaning gas port opening/closing valve 111A is connected to this port 111. A cleaning gas feed pipe 112 connected to the cleaning gas feed port 111 is connected to a cleaning gas source 115 through a mass-flow controller 113 serving as a flow rate adjusting valve and an opening/closing valve 114. In this manner, a ClF-based gas, e.g., a $ClF_3$ gas, serving as a cleaning gas can be supplied such that the $ClF_3$ gas is vaporized by bubbling.

A branched pipe 116 is connected midway along the cleaning gas feed pipe 112, and a second nitrogen source 119 is connected to the branched pipe 116 through a mass-flow controller 117 and a sixth opening/closing valve 118F. In this manner, the cleaning gas is diluted with a nitrogen gas from the second nitrogen source 119 as needed, so that the concentration of the cleaning gas can be controlled.

The mass-flow controllers, the opening/closing valves, and the like are controlled by a control unit 120 on the basis of a prestored program.

A ClF-based gas, e.g., a $ClF_3$ gas, used as a cleaning gas has a boiling point of about +17° C. and is liquefied when a temperature at which the cleaning gas is used is about +10° C. For this reason, the ClF$_3$ gas is liquefied again through the cleaning gas supply system by adiabatic expansion or the like in a certain case. In order to prevent the cleaning gas from being liquefied, a heating mechanism is arranged on the cleaning gas feed pipe 112 to be described later.

On the other hand, although the inner wall surface of the processing chamber 61 and the inner/outer wall surfaces of the supply header 90 are subjected to a surface polishing treatment to prevent the ClF$_3$ gas from being deposited on these wall surfaces, deposition of the ClF$_3$ gas cannot be completely prevented. Therefore, in order to substantially completely prevent the deposition of the ClF$_3$ gas, a header heating means 122 is arranged in the shower header 90. This header heating means 122, as shown in FIG. 6, is constituted by a medium path 123 formed throughout the entire side wall of the header and a ceramic heater 124. Warm water heated to a maximum of 100° C. flows into the medium path 123. If the shower header 90 is to be heated to a higher temperature, the ceramic heater 124 is energized, so that the shower header 90 is heated to a temperature falling within the range of about 100° C. to 200° C.

The medium path 123 is constituted as follows. That is, the medium path 123 is branched on the feed-in side into two paths, i.e., a warm water path and a cool water path, and warm water or cool water can selectively flow into the medium path 123 as needed such that switching valves 125 and 126 are operated by a command from the control unit 120. In a film formation process, the shower header 90 is cooled by causing the cool water flow into the medium path 123, thereby preventing a film from being formed in the header 90.

In addition, a wall portion heating means 127 having the same arrangement as that of the header heating means 122 is formed in the wall portion of the processing chamber 61. This heating means 127 is also constituted by a ceramic heater 128 and a medium path 129. When the wall portion is heated by the wall portion heating means 127, film formation on the inner wall surface and deposition of the ClF$_3$ gas during cleaning can be prevented.

Figure 7:
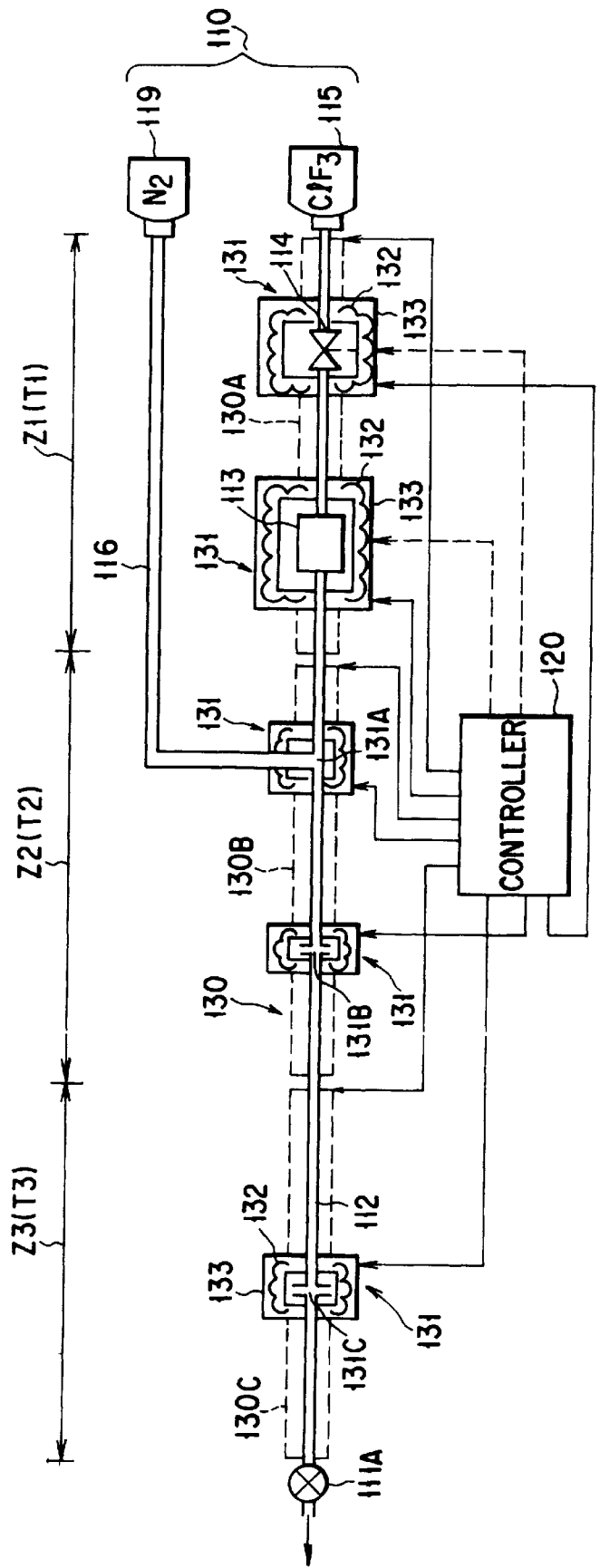
FIG. 7 is a view showing in detail a cleaning gas supply system used for the apparatus shown in FIG. 5.

The heating mechanism of the above cleaning gas feed pipe 112 will be described below with reference to FIG. 7.

This heating mechanism is constituted by a liquefaction-prevention heating mechanism 130 and an individual heating mechanism 131.

The liquefaction-prevention heating mechanism 130 is arranged over the entire length of the cleaning gas feed pipe 112. The liquefaction-prevention heating mechanism 130 is divided into a plurality, e.g., three in FIG. 7, of zones Z1 to Z3 in its longitudinal direction. The three zones Z1, Z2, and Z3 are respectively constituted by a first heating tape 130A, a second heating tape 130B, and a third heating tape 130C, all of which are wound along the gas feed pipe 112. These heating tapes are formed such that, e.g., a resistance heating wire is sandwiched by Teflon tapes. With this arrangement, the heating tape can be wound around a desired portion.

Respective temperatures T1, T2, and T3 of the heating tapes 130A to 130C in the zones Z1 to Z3 have a temperature gradient such that the temperature gradually increases toward the processing vessel 61. For example, the temperature T1 is set at 20° C., the temperature T2 is set at 30° C., and the temperature T3 is set at 40° C., thereby preventing the cleaning gas from being liquefied.

Even if the liquefaction-prevention heating mechanism 130 is arranged in the this manner, since the ClF$_3$ gas is easily liquefied as described above, liquefaction tends to occur at a portion where liquefaction easily occurs (i.e., a portion where the area of a flow path changes), e.g., the mass-flow controller 113, the opening/closing valve 114, or joint portions 131A, 131B, 131C where narrow gaps are formed. Thus, the individual heating mechanisms 131 are individually arranged to these portions. The respective individual heating mechanisms 131 are identical to each other. For example, metal boxes 133 which incorporate, e.g., ceramic heaters 132 entirely cover the respective portions where liquefaction easily occurs such as the joint portions 131A to 131O, the mass-flow controller 113, and the opening/closing valve 114 to form a kind of constant temperature chambers.

Each metal box 133 is set at a relatively high temperature, e.g., about 50° C., by a command from the controller 120, thereby completely preventing the cleaning gas at each portion from being liquefied.

Note that the number of zones is not limited to three as in the above description, and it can be decreased or increased as needed.

In the present invention, since a ClF-based gas is used as a cleaning gas, portions exposed to this gas, e.g., the inner wall of the processing chamber 61, the susceptor 80, the electrostatic chuck 82, or the like, must consist of a material having high resistance to corrosion with respect to the ClF-based gas, and the material must be used at a temperature at which the material can have the high resistance to corrosion.

As the material, polyimide, silicone rubber, or the like cannot be used. A ceramic-based material such as SiC or alumina, Teflon, quartz glass (200° C. or less), carbon (300° C. or less), and the like can be used. When the electrostatic chuck consists of the above material, e.g., quartz glass, the electrostatic chuck is formed such that a conductive film is sandwiched by the quartz glass.

Materials which can be used in a ClF-based gas atmosphere are shown in Table 1.

TABLE 1

| Temperature of Respective Materials for Resistance to Corrosion with Respect to ClF$_3$ | |
| --- | --- |
| SUS 430 | −70° C. |
| SUS 304 | −120° C. |
| SUS 316 | −120° C. |
| Aluminium | −400° C. |
| Nickel | −600° C. |
| Inconel | −300° C. |
| Quartz | −150° C. |
| Al$_2$O$_3$ | −400° C. |
| SiC | −300° C. |
| ZrO$_2$ | −400° C. |
| AlN | −400° C. |

The formation operation of a tungsten film in the processing apparatus having the above arrangement will be described below.

First, the susceptor 80 is heated by optical energy from the halogen lamp 84, and the wafer 8 placed on the susceptor 80 is kept at a predetermined process temperature. At the same time, the processing chamber 61 is evacuated by the vacuum pump 87, the first processing gas from the first processing gas source 107A and the second processing gas from the second processing gas source 107B are fed into the processing chamber 61 while their flow rates are controlled, and the internal atmosphere of the processing chamber 61 is kept at a predetermined process pressure, thereby performing the formation of the tungsten film.

In this example, a $WF_6$ gas and an $SiH_4$ gas are used as the first and second gases, and these gases are respectively diluted at predetermined concentrations with a nitrogen gas from the first nitrogen source 109 and then fed into the mixing chamber 97A on the uppermost stage of the supply header 90, or these gases are fed into the mixing chamber 97A without being diluted. These two types of processing gases fed into the mixing chamber 97A are mixed with each other therein, and at the same time, fed, through the communication hole 94A of the partition plate 94, into a diffusion chamber 97B on a stage which is immediately below the mixing chamber 97A. This gas mixture is fed, through the diffusion holes 95A of the diffusion plate 95, into the straightening chamber 97C on a stage which is immediately below the diffusion chamber 97B. Thereafter, the gas mixture is uniformly supplied throughout the entire surface of the wafer through the flow-uniforming holes 96A of the straightening plate 94. In this case, since the processing gases fed into the header are mixed with each other while these gases are gradually expanded in the plurality of chambers, two types of processing gases can be uniformly mixed with each other. In addition, since the diameter of the straightening plate 96 at the lowermost end of the header 90 is set to be slightly larger than the diameter of the wafer W, the processing gas mixture can be uniformly supplied throughout the entire surface of the wafer.

When the temperature of the shower header 90 or the temperature of the inner wall of the processing chamber 61 increases during a film formation process, reaction products are formed on not only the wafer surface but also the wall surface of the supply header 90, the inner wall surface of the processing chamber 61, or the like. In order to prevent this, during this process, a coolant consisting of cold water having a temperature of about 15° C. flows into the medium path 123 of the header heating means 122 arranged in the supply header 90 and the medium path 128 of the wall portion heating means 127 arranged in the wall portion of the processing chamber 61 to cool the shower header 90 and the wall portion of the processing chamber, thereby preventing films from being formed on the shower header 90 and the processing vessel. The same cooling operation as described above is performed in each of the processing chambers 2 and 3 during the process, thereby preventing films from being deposited on portions on which these films should not be formed.

After the series of processes of the wafer 1 are performed by a predetermined number of wafers, e.g., 1 lot (25 wafers), films are deposited in the processing apparatus in a very small amount. Therefore, in order to remove the films deposited on portions on which these films should not be formed, a cleaning operation is performed.

This cleaning operation will be described on the basis of FIG. 5. Upon completion of film formation process, the first and second opening/closing valves 106A and 106B of the processing gas supply system 100 are closed to stop supply of the first processing gas and the second processing gas.

First, in an evacuation state by driving the vacuum pump, a $ClF$-based gas, e.g., a $ClF_3$ gas is generated from the cleaning gas source 115. While the flow rate of the $ClF_3$ gas is controlled by the mass-flow controller 113, the $ClF_3$ gas is fed into the cleaning feed pipe 112 and supplied from the cleaning gas feed port 111 into the shower header 90. This cleaning gas flows down the shower header 90 into the processing chamber 61. The cleaning gas reacts with films or pieces of films deposited on the wall surface of the header, the inner wall of the processing vessel, the susceptor 80, or the like. With this operation, these deposits are removed and exhausted through the exhaust pipe 86 of the vacuum exhaust system 88. In this case, the flow rate of the $ClF_3$ gas is set to, e.g., 5 l/min. or less. The nitrogen gas is supplied from the second nitrogen source 119 as needed while its flow rate is controlled, thereby diluting the cleaning gas. The pressure in the processing vessel is kept to fall within the range of, e.g., 0.1 to 100 torr.

When the $ClF_3$ gas remains on the header, the surface of the inner wall of the processing vessel, or the like, the $ClF_3$ gas isolated from the wall surface in the film formation process subsequently performed after the cleaning process is entrapped in a film during its formation, thus causing a defect.

In order to completely prevent the $ClF_3$ gas from being deposited on the wall surfaces, the above parts are heated. More specifically, a medium consisting of warm water having a temperature of, e.g., about 80° C. flows into the medium path 123 of the header heating means 122 arranged in the shower header 90 and the medium path 129 arranged in the wall portion of the processing chamber 61, thereby heating the shower header 90 and the wall portion of the processing chamber 61. In this case, the ceramic heater 124 arranged in the header and the ceramic heater 128 arranged in the wall portion of the processing chamber 61 are energized to set a cleaning temperature high.

A wafer mounting table 26 and the vicinity thereof can be heated to a predetermined temperature by driving a halogen lamp 84 used for heating the wafer. The cleaning temperature at this time is set to fall within the range of, e.g., 17° C. as a boiling temperature of the $ClF_3$ gas to 700° C. When the susceptor 80 is to be heated in cleaning, the susceptor itself and the electrostatic chuck 82 consist of materials, as shown in Table 1, having a high resistance to corrosion with respect to the $ClF_3$ gas, and these temperatures are set to fall within the range wherein the high resistance to corrosion can be increased, thereby avoiding a problem of corrosion.

In this manner, since the shower header, the wall surface of the processing vessel, and the like are heated during the cleaning operation, the cleaning gas is not absorbed in the wall surface of the processing vessel. Therefore, in the film formation process restarted upon completion of cleaning, the $ClF_3$ gas, which causes a defect, is not entrapped in a film during its formation, thereby greatly increasing a yield.

When the cleaning gas flows, a nitrogen gas serving as an inert gas from the first nitrogen source 109 arranged in the processing gas supply system 100 is simultaneously supplied into the shower header 90 thorough both the first and second processing gas feed pipes 103 and 104. In this case, the supply pressure of the nitrogen gas is set to be slightly higher than the supply pressure of the cleaning so as not to cause the cleaning gas to reversely flow into the first and second processing gas feed ports 101 and 102. In this manner, when an inert gas flows into each of the processing gas supply systems 100 during the cleaning process, the cleaning gas is prevented from reversely flowing from the first and second processing gas feed ports 101 and 102 into the processing gas feed pipes 103 and 104, thereby preventing the cleaning gas from being deposited on the inner surfaces of the processing gas feed pipes 103 and 104. Therefore, with this operation, the $ClF_3$ gas is not entrapped into the film being formed in the film formation process restarted upon completion of a cleaning process, and the shower header and wall portions are heated, thereby further increasing a yield.

The cleaning gas of the cleaning gas supply system 110 is feed. At the same time, the liquefaction-prevention heating mechanism 130 and the plurality of individual heating mechanisms 131, all of which are arranged on the cleaning gas feed pipe 112 of the cleaning gas supply system 110, are driven to prevent the ClF$_3$ gas from being liquefied. More specifically, the respective heating tapes 130A, 130B, and 130C of the liquefaction-prevention heating mechanism 130 which is divided into the three zones Z1 to Z3 are energized to set the temperatures T1, T2, and T3 of the zones to 20° C., 30° C., and 40° C., respectively. In this manner, the liquefaction-prevention heating mechanism 130 has a temperature gradient such that the temperature gradually increases along the downstream direction of the cleaning gas, thereby preventing the ClF$_3$ gas in the path from being liquefied.

In this case, the ClF$_3$ gas may be liquefied by insufficient heating using the heating tapes at a portion where the area of a flow path changes in the path, or a portion where a narrow gap is formed by a joint. The individual heating mechanisms 131 constituted by the metal boxes 92 and the ceramic heaters 90 are arranged these portions where liquefaction easily occurs, e.g., the mass-flow controllers 113 and 114, and joint portions so as to cover these portions where liquefaction easily occurs. Since these portions where liquefaction easily occurs are heated to about 50° C. by the individual heating mechanisms 131, liquefaction of the ClF$_3$ gas in the cleaning gas supply system 110 can be perfectly prevented, thereby greatly increasing the operating efficiency of the apparatus.

The processing apparatus of this embodiment can be applied to one processing chamber of the above multi-chamber processing apparatus. In this case, the multi-chamber processing apparatus is cleaned by supplying the cleaning gas into not only the processing chamber but also first and second convey chambers 34 and 46, first and second preliminary vacuum chambers 42 and 43, and first and second cassette chambers 50 and 51 as needed. For this reason, the cleaning gas supply system and the vacuum exhaust system are connected to first and second convey chambers 34 and 46, first and second preliminary vacuum chambers 42 and 43, and first and second cassette chambers 50 and 51 similar to the processing chamber.

In this multi-chamber processing apparatus of this embodiment, the wall portion heating means 127 is arranged on the wall portion of each chamber. In addition, heaters are preferably buried in arms 39A and 53A of convey units 39 and 53 in the first and second convey chambers 34 and 46. In cleaning, these portions are heated by these heating means, thereby preventing the ClF-based gas from being deposited on these portions. Members of these chambers, e.g., the arms 39A and 53A of the convey mechanisms 39 and 53 or a gear, consist of materials, shown in Table 1, having a high resistance to corrosion with respect to the ClF-based gas. For example, the arms 39A and 53A consist of Teflon (tradename).

The wafer convey path is cleaned in this manner. When the processed wafer 1 is to be transferred by a transfer means, film fractions peeling from the wafer to drop or float can be eliminated to remove particles, thereby further increasing the yield of products.

Since the cleaning gas supply system is individually arranged on the conventional vacuum processing apparatus for film formation, it can be easily applied with a minimum change in design.

A processing apparatus according to still another embodiment of the present invention will be described below with reference to FIG. 8. An one-by-one type processing hot wall processing apparatus used for film formation such as an insulating interlayer will be shown in FIG. 8. As shown in FIG. 8, this processing apparatus has a processing chamber 142 for processing a target object, e.g., a semiconductor wafer 1, one by one. This processing chamber 142 is formed as a flat cylindrical vessel using a material having a high heat resistance and which is dustproof such as quartz. A heating coil 144 as a heating means is arranged on the outer surface of the processing chamber 142, and the interior of the processing chamber 142 is heated to a predetermined temperature by this heating coil 144.

A susceptor 145 as a support member for mounting one semiconductor wafer 1 is arranged almost at the center of a bottom surface 142A in the processing chamber 142. An optically transparent quartz window 146 opposing in parallel to the susceptor 145 is arranged at a position below the susceptor 145 on the bottom surface of the processing chamber 142. A heating lamp 147 comprising a halogen lamp or the like is parallelly arranged as a heating means slightly below the quartz window 146. Optical energy of the heating lamp 147 is radiated onto the lower surface of the susceptor 145 through the quartz window 146, thereby heating the semiconductor wafer 1 to a predetermined temperature.

On the other hand, a gas dispersion/supply unit 148 is arranged above the susceptor 145 to oppose the susceptor 145. A processing gas or a cleaning gas is supplied from the gas dispersion/supply unit 148 into the processing chamber 142. The gas dispersion/supply unit 148 is formed to have a hollow disk-like shape. A gas supply pipe 148A is connected to the center of the upper surface thereof, and a large number of gas supply holes 148B are formed in the lower surface thereof.

As shown in FIG. 8, a processing gas supply system 149 for supplying a processing gas is connected to the gas supply pipe 148A of the gas dispersion/supply unit 148 through a pipe 150, and a predetermined processing gas is supplied into the processing chamber 142 through the gas dispersion/supply unit 148 by opening a valve 151 connected to the pipe 150.

When, e.g., an insulating interlayer is to be formed in the processing chamber 142, a gas mixture of TEOS and ozone at a predetermined ratio is supplied from the processing gas supply system 149. In addition to an insulating interlayer, a gate electrode, a gate insulating film, or the like can be formed. An organosilicon compound such as TEOS, an organophosphorus compound, an organoboron compound, an organoarsenic compound, and the like are used as processing gases used for these films.

When a metal wiring film is to be formed, a halogenide, a carbonyl compound, and an organometallic compound are used as processing gases. These processing gases are supplied together with an oxidizing gas or a reducing gas, and a predetermined film is formed on the semiconductor wafer 1 by a reaction between these gases.

This processing gas is preferably formed of a compound which has a relatively high vapor pressure and can be supplied from a gas supply source to the processing chamber 142 in a gaseous state. When an organic-based source which is kept as a liquid or tends to be liquefied at room temperature is used as a processing gas, film formation is performed such that the inner wall surface of the processing chamber 142 is heated to a temperature almost equal to that of the susceptor 5 by the heating coil 144. Alternatively, when a metal fluoride or the like kept as a gas at room temperature is used as a processing gas, the heating coil 144 is kept disabled, and film formation is performed such that the temperature of the inner wall surface of the processing chamber 142 is kept lower than that of the susceptor 145.

As shown in FIG. 8, a cleaning gas supply system 152 for supplying a cleaning gas is connected to the pipe 150 through a pipe 153, and the cleaning gas is supplied from the cleaning gas supply system 152 into the processing chamber 142 through the pipe 153, the pipe 150, and the gas dispersion/supply unit 148 by closing a valve 154 arranged on the pipe 153 during cleaning. That is, in this embodiment, the gas dispersion/supply unit 148 serves as a gas supply portion of the cleaning gas.

The cleaning gas supply system 152 comprises a $ClF_3$ gas bomb 155 for storing a $ClF_3$ gas serving as a cleaning gas and a nitrogen gas bomb 156 for storing a dilution gas, e.g., a nitrogen gas, for diluting the $ClF_3$ gas. These gas bombs 155 and 156 are connected to the end portions of pipes 153A and 153B branched from the pipe 153, respectively.

A valve 157, a mass-flow controller 158, and a valve 159 are sequentially connected to the pipe 153A, to which the $ClF_3$ gas bomb 155 is connected, from the upstream side to the downstream side. A valve 160, a mass-flow controller 161, and a valve 162 are sequentially connected to the pipe 153B, to which the nitrogen gas bomb 156 is connected, from the upstream side to the downstream side. The gases from these bombs 155 and 156 are mixed with each other in the pipe 153, and the cleaning gas is supplied into the processing chamber 142 through the pipe 150 by opening the valve 154.

On the other hand, exhaust ports 163 are formed in the bottom surface 142A of the processing chamber 142 near the susceptor 145. A vacuum pump 165 is connected to the exhaust ports 163 through an exhaust pipe 164, the processing chamber 142 is evacuated by the vacuum pump 165, and the processing chamber 142 is set at a predetermined degree of vacuum. The exhaust ports 163, the exhaust pipe 164, and the vacuum pump 165 are constituted so as to serve as gas exhaust portions of the cleaning gas. As the vacuum pump 165, an oil-free dry pump is preferably used not to be affected by the exhausted gas.

A toxicity-removing unit 166 for catching toxic gases such as the processing gas or cleaning gas exhausted from the vacuum pump 165 to remove these toxic gases from the exhausted gas is arranged on the downstream side of the vacuum pump 165. As the toxicity-removing unit 166, a unit filled with a solvent, e.g., an alkaline solution for easily dissolving $ClF_3$, is used. A gate valve 167 is arranged on the side surface of the processing chamber 142, and connected to a convey chamber (not shown) for loading/unloading the semiconductor wafer 1 through this gate valve 167.

A formation process of an insulating interlayer using the above one-by-one type processing hot wall processing apparatus will be described below. For example, the semiconductor wafer 1 is supported by the susceptor 145 in the processing chamber 142, and radiated by optical energy from the heating lamp 147 through the quartz window 146 to heat the semiconductor wafer 1 supported by the susceptor 145 to about 500° C. In parallel with this operation, the processing chamber 142 is heated by the heating coil 144 to heat the wall portion of the processing chamber to a temperature equal to that of the susceptor 145. Thereafter, the valve 153 of the processing gas supply system 149 is opened, and the gas mixture of TEOS and ozone adjusted at a predetermined ratio is supplied from the valve 153 into the processing chamber 142 through the pipe 150 and the gas dispersion/supply unit 148. With this operation, ozone is activated on the surface of the heated semiconductor wafer 1 to generate active oxygen. TEOS is dissolved with this active oxygen, and a silicon oxide film is formed on the surface of the semiconductor wafer 1. In addition, in this film formation, the reaction product reflows to planarize the silicon oxide film. On the other hand, the processing gas after the process is exhausted outside the chamber by the operation of the vacuum pump 165 through the exhaust ports 163 and the exhaust pipe 164. Toxicity of this exhausted gas is removed by the toxicity-removing unit 166, and then the gas is exhausted outside the chamber.

Films are formed on the inner surface of the processing chamber 142, the susceptor 145, and other portions of the processing chamber 142 in this film formation process. When the film formation process is repeated a predetermined number of times, these films are stacked, and these films are eventually peeled to form particles. These particles float in the chamber to contaminate the cleaned semiconductor wafer 1 as described above. These particles are gradually deposited on the bottom surface of the processing chamber 142 and float in loading/unloading the semiconductor wafer 1. Consequently, the semiconductor device 1 may be undesirably contaminated by these particles.

After the film formation process is performed several times, the film formation process is temporarily interrupted, and the processing chamber is cleaned by supplying a cleaning gas thereinto, thereby removing dust such as particles or the like. A cleaning procedure in this embodiment is the same as in the first embodiment. That is, the power supply for such as the heating lamp 147 of the processing chamber 142 is turned off, and a state wherein no semiconductor wafer 1 is present in the processing chamber 2 is kept. Then, after the gate valve 167 is closed to disconnect the processing chamber 142 from the outer circumstance, the $ClF_3$ gas is supplied as the cleaning gas from the processing gas supply system 149 into the processing chamber 142 through pipe 150 and the gas dispersion/supply unit 148 as indicated by arrows in FIG. 8. In this cleaning, the processing gas in the processing chamber 142 is preferably substituted with a nitrogen gas in advance.

Then, the vacuum pump 165 is driven at room temperature higher than the boiling point of $ClF_3$, and the nitrogen gas is exhausted from the processing chamber 142 to keep the chamber 142 at a predetermined degree of vacuum. While this evacuation state is kept, the valves 157 and 159 of the cleaning gas supply system 152 are opened at a predetermined degree of opening, and the $ClF_3$ gas is supplied through the pipe 153 such that the flow rate of the $ClF_3$ gas in the processing chamber 142 is controlled by the mass-flow controller 158 to a predetermined flow rate, e.g., 5 l/min. or less. The cleaning gas is fed from the gas dispersion/supply unit 148 connected to the pipe 153 into the processing chamber 142. The pressure of the $ClF_3$ gas in the processing chamber 142 is kept at 0.1 to 100 Torr. At this time, the consumed cleaning gas in the processing chamber 142 is constantly exhausted from the exhaust ports 163 of the processing chamber 142 through the exhaust system such as the vacuum pump 165, thereby replenishing the fresh cleaning gas. Therefore, the interior of the processing chamber 142 can be effectively cleaned using a fresh cleaning gas.

Since the $ClF_3$ gas supplied into the processing chamber 142 is a chemically active gas, the $ClF_3$ gas reacts with deposits such as silicon-based films, thereby removing deposits. Therefore, the interior of the processing chamber 142 can be properly cleaned. Even if silicon-based particles are deposited in the processing chamber 142, the $ClF_3$ gas spreads in all the chamber to perfectly remove, by the $ClF_3$ gas, the particles and the like deposited on not only the inner surface of the processing chamber 142 but also the susceptor 145 in the chamber. In addition, since the reaction between the $ClF_3$ gas and the films or the like is a exothermic reaction, this heat generation more accelerates the reaction of the $ClF_3$ gas, so that deposits such as a film can be effectively removed.

Since the cleaning gas is exhausted outside the chamber through the exhaust pipe 164, the exhaust pipe 164 on which films of reaction products are easily formed can be cleaned by the cleaning gas in the same manner as in the interior of the processing chamber 2 so as to remove the films. Since toxic gasses exhausted from the exhaust system can be removed by the toxicity-removing unit 166, clean exhaust can be performed.

When the cleaning gas is distributed in each chamber at a predetermined concentration, exhaustion of the cleaning gas may be stopped for a predetermined period of time, or supply of the cleaning gas may be stopped for a predetermined period of time after exhaustion is stopped. Alternatively, exhaustion and supply of the cleaning gas may be repeated in a pulsed form. In this cleaning, a cleaning atmosphere may be heated.

When only the $ClF_3$ gas is used as a cleaning gas, cleaning is preferably performed under the following conditions as in the first embodiment: the flow rate of the $ClF_3$ gas is set to be 5 l/min. or less; the temperature of the $ClF_3$ gas is set to be the boiling point of $ClF_3$ to 700° C.; and the internal pressure is set to be 0.1 to 100 Torr. Alternatively, when the $ClF_3$ gas is diluted with an inert gas, e.g., a nitrogen gas, to suppress the reactivity of the $ClF_3$ gas, an object to be cleaned is moderately cleaned, and damage to the object can be relieved.

As has been described above, in this embodiment, when the plasmaless $ClF_3$ gas is supplied as the cleaning gas into the processing chamber 142, all the processing chamber 142 can be cleaned to remove deposits deposited on the bottom and the inner surfaces of the processing chamber and the susceptor 145. When the number of steps of film formation as of an insulating interlayer increases in the manufacture of a semiconductor integrated circuit element consisting of a wiring multilayer and having a capacity equal to or larger than that of a 64-M DRAM, the interior of the processing chamber 142 can be completely cleaned, and a contamination source such as particles which poses a problem in the manufacture of a semiconductor integrated circuit element having a degree of integration equal to or higher than that of the 64-M DRAM can be removed. In this embodiment, although the $ClF_3$ gas is an active gas, the $ClF_3$ gas rarely corrodes the materials of the apparatus. Since the $ClF_3$ gas is a plasmaless gas, very moderate cleaning can be performed. Moreover, when the cleaning gas supply system 152 serving as a cleaning system is arranged in the processing chamber 142 of a conventional one-by-one type hot wall pressing apparatus, effective cleaning can be performed at very low costs. As a matter of course, according to the method described above, a cleaning time can be made shorter than that of a method for disassembling the apparatus to clean it.

Figure 9:
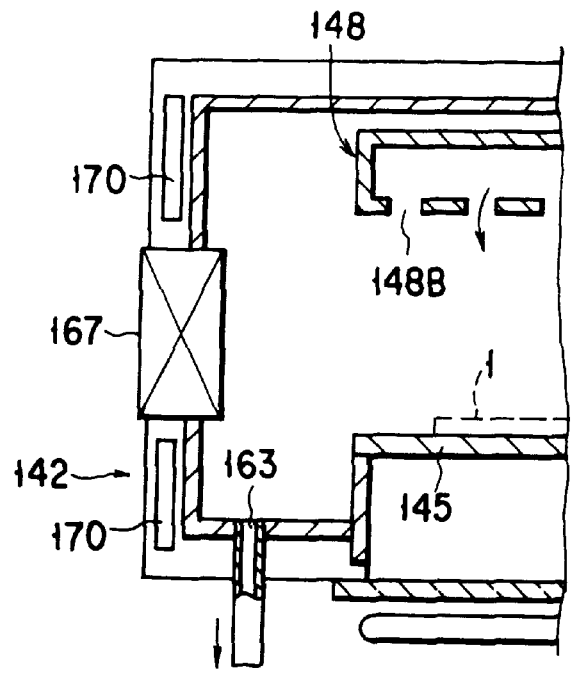
FIGS. 9 and 10 are views showing modifications of the apparatus shown in FIG. 7.

Note that when a gas, such as a combination of $WF_6$ and $SiH_4$, used for a film formation process generates a reaction product which tends to deposit on the wall surface, a coolant flow path 170 is arranged in the wall portion of the processing chamber 142 as shown in FIG. 9, and deposition of the reaction product is prevented by flowing a coolant therethrough.

Figure 10:
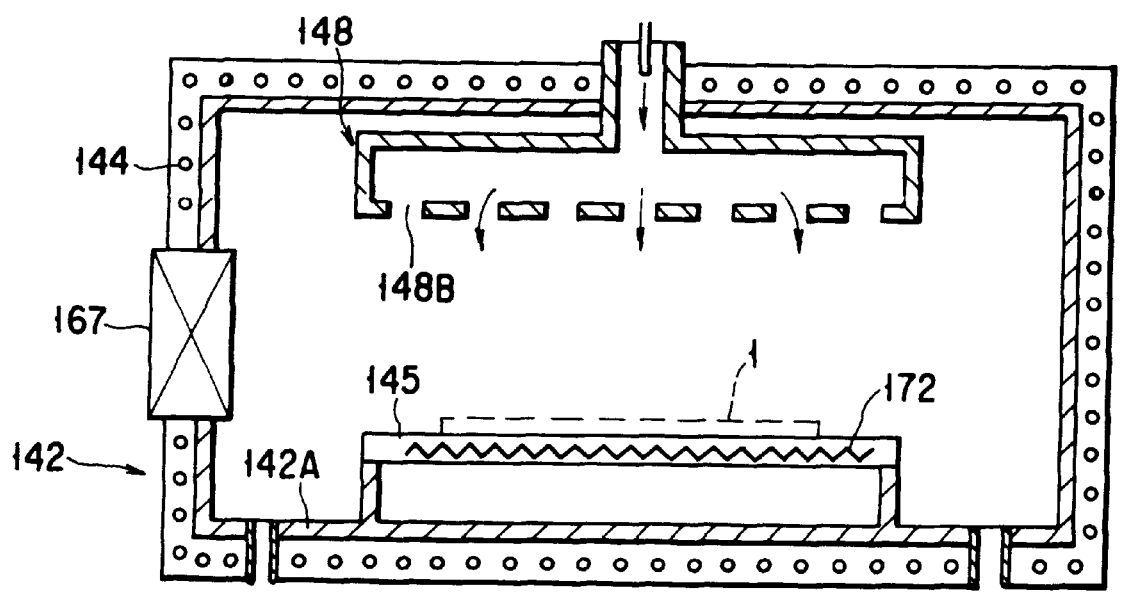

In addition, as shown in FIG. 10, a film formation apparatus may be proposed wherein a heater 172 comprising a heating resistor is arranged on the susceptor 145 in place of the heating lamp 147, and the semiconductor wafer 1 is heated by the heater 172.

Still further, the gas dispersion/supply unit 148 may be constituted as shown in FIGS. 11 and 12. A gas diffusion plate 173 for diffusing a gas is arranged in the gas dispersion/supply unit 148, and a gas blow plate 174, called as a shower plate, for blowing a processing gas into the processing chamber 1 is arranged at the downstream side of the gas dispersion/supply unit 148. A large number of gas blow holes 175 each having a hole diameter of, e.g., 1.5 mm are distributed and formed in the aluminum disk-like main body of the gas blow plate 174. Note that another material, e.g., quartz or ceramic, except for aluminum can be used as a material for the gas blow plate 174.

A bent coolant flow path 176 is formed in the gas blow plate 174. The inlet and outlet of this coolant flow path 176 are connected to a circulating system (not shown) including a cooler and the like for a coolant such as cooling water. The temperature of the cooling water at the inlet of the coolant flow path 176 is set to about a temperature limit for preventing freezing of the cooling water, e.g., in the range of −10° C. to 70° C. A coolant flow path 177 is also formed in the side wall of the gas dispersion/supply unit 148 to flow a coolant such as cooling water. The cooling effect for the gas blow plate 174 is further enhanced by this coolant flow path 177.

In this embodiment, for example, $WF_6$ and $SiH_4$ (monosilane) gases serve as processing gases, and these gases together with a carrier gas, as needed, are supplied from the processing gas supply pipe 150 to the gas dispersion/supply unit 148 and blown in the processing chamber 142 from the gas blow holes 175 of the gas blow plate 174. The pressure of the processing chamber 142 is set to, e.g., 0.2 to 0.5 Torr. At the same time, the semiconductor wafer 1 is heated to, e.g., 300 to 400° C. by the heating lamp 147. Tungsten silicide produced by the reaction between $WF_6$ and $SiH_4$ is attached and deposited on the surface of the wafer 1.

On the other hand, when the cooling water is kept supplied to the coolant flow paths 176 and 177 in the gas dispersion/supply unit 148, the temperature of the gas blow plate 174 is set to a temperature of 10° C. or less, e.g., −5° C. In this case, the gas blow plate 174 is heated to a high temperature of 150° C. or more unless cooling using cooling water is performed. When the processing gas is blown from the gas blow plate 174, or the processing gas having been supplied to the processing chamber 142 collides against the wall surface and the like and returns to the gas blow plate 174, $WF_6$ reacts with $SiH_4$ to attach and deposit tungsten silicide or a W compound produced as a result of incomplete thermal decomposition on the gas blow plate 174. As in this embodiment, when the gas blow plate 174 is kept cooled, the reaction between $WF_6$ and $SiH_4$ is suppressed, and an amount of deposit as a reaction product can be reduced. Therefore, production of particles caused by peeling of the deposits from the gas blow plate 174 can be prevented.

The flow rate of the processing gas properly corresponds to the amount of deposit on the wafer 1 because the reaction between $WF_6$ and $SiH_4$ is suppressed on the gas blow plate 174. As a result, the film thickness on one wafer can be almost equal to that of another wafer, thereby improving uniformity. FIG. 13 is a graph obtained by quantitatively plotting a relationship between a wafer number plotted along the abscissa and the thickness of a W film plotted along the ordinate. Solid lines a and b and a dotted line c represent that the gas blow plate 174 is cooled, cooling is incomplete, and no cooling is performed, respectively.

In this graph, a prospective film thickness is, e.g., 1000 to 5,000 Å. The film formation conditions in this test are identical to the above process conditions. In the solid line a, the gas blow plate 174 is cooled to, e.g., 5° C. by cooling water. As can be understood from the graph of FIG. 12, it is confirmed that the gas blow plate 174 is cooled to greatly improve uniformity between the film thicknesses of the individual wafers, and that the amount of deposits on the gas blow plate 174 is small. In formation of a tungsten silicide film using $WF_6$ and $SiH_4$, the gas blow plate 174 must be cooled to a temperature of 10° C. or less to effectively reduce the amount of deposits on the gas blow plate 174 due to the following reason.

The present inventor variously adjusted the temperature of a coolant to variously change the temperature of the gas blow plate 174 and observed the deposition states of reaction products. It was found that the amount of deposits was reduced at a temperature of 10° C. or less, but that the amount of deposits was increased at a temperature of 11° C. or more. A cooling means for cooling the gas blow plate is not limited to the coolant flow path, but can be constituted by, e.g., a Peltier element.

A method of cooling the blow plate can also be applied to formation of a tungsten silicide film using $SiH_2Cl_2$ (dichlorosilane) and $WF_6$ gases. In this case, a wafer is heated to 500 to 600° C., and the temperature of the gas blow plate can be suppressed to 50° C. or less with cooling.

Note that a film to be cleaned is not limited to the metal tungsten film, and the above cleaning can be applied to $MoSi_2$, $WSi_2$, TiN, TiW, Mo, $SiO_2$, Poly-Si, or the like. As a processing gas, a gas corresponding the film formation of each of the above films is used. For example, when a tungsten film is to be formed, in addition to a combination of $WF_6+SiH_4$, a combinations of $WF_6+H_2$ or $WF_6+Si_2H_6$, or the like can be used. When a WSix film is to be formed, a combination of $WF_6+SiH_4$, a combination of $WF_6+Si_2H_6$, a combination of $WF_6+SiH_2Cl_2$, or the like can be used.

In addition, an inert gas to be used is not limited to an N2 gas. Another inert gas, e.g., He, Ar, Xe, or the like can be used.

The present invention can be applied to not only the above CVD apparatus but also a sputtering apparatus, a diffusion apparatus, or the like. As a target object to be processed, not only a semiconductor wafer but also an LCD substrate or the like can be used.

What is claimed is:

1. A vacuum processing apparatus comprising:

a vacuum processing chamber housing a target object for applying a predetermined treatment to the target object;

a mounting table, arranged within said vacuum processing chamber, for mounting a target object;

a processing gas supply system for independently supplying a processing gas for performing a specific process to the target object;

a cleaning gas supply system, arranged independently of said processing gas supply system, for supplying a cleaning gas containing $ClF_3$ to the mounting table; and liquefaction-prevention heating means for preventing liquefaction of the cleaning gas by heating said cleaning gas supply system, said liquefaction prevention heating means including first and second heating means which respectively heat first and second zones of said cleaning gas supply system, and wherein said second heating means heats said second zone to a temperature higher than a temperature to which said first heating means heats said first zone.

2. A vacuum processing apparatus according to claim 1, further comprising heating means for heating a portion where liquefaction of the cleaning gas tends to occur in said cleaning gas supply system.

3. A vacuum processing apparatus according to claim 1, wherein the second zone of the cleaning gas supply system is positioned on the downstream side of cleaning gas supply system relative to the first zone.

4. A vacuum processing apparatus comprising:

a processing chamber housing a target object for applying a predetermined treatment to the target object;

a supporter for supporting the target object in the processing chamber;

a processing gas supply system for supplying a processing gas into the processing chamber, for performing a predetermined process on the target object;

a cleaning gas supply system arranged independently of said processing gas supply system, for supplying a cleaning gas containing $ClF_3$ into the processing chamber, the cleaning gas supply system including a feed pipe having one end connected to the processing chamber, through which the cleaning gas is supplied to the processing chamber;

liquefaction-prevention heating mechanism including a plurality of zones provided along the feed pipe and configured to control a temperature of each of the plurality of zones so as to produce a temperature gradient such that the temperature gradient increases toward said one end of the feed pipe.

5. A vacuum processing apparatus according to claim 4, further comprising at least one heating member provided on a portion of the feed pipe where liquefaction of the cleaning gas tends to occur in said feed pipe, for heating the portion to a temperature higher than the maximum temperature of said temperature gradient.

* * * * *